(12) United States Patent
Reznicek et al.

(10) Patent No.: US 11,302,813 B2
(45) Date of Patent: Apr. 12, 2022

(54) WRAP AROUND CONTACT FOR NANOSHEET SOURCE DRAIN EPITAXY

(71) Applicant: International Business Machines Corporation, Armonk, NY (US)

(72) Inventors: Alexander Reznicek, Troy, NY (US); Xin Miao, Slingerlands, NY (US); Choonghyun Lee, Rensselaer, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 16/720,727

(22) Filed: Dec. 19, 2019

(65) Prior Publication Data
US 2021/0193829 A1  Jun. 24, 2021

(51) Int. Cl.
| | |
|---|---|
| *H01L 29/78* | (2006.01) |
| *H01L 29/06* | (2006.01) |
| *H01L 29/423* | (2006.01) |
| *H01L 29/66* | (2006.01) |
| *H01L 29/40* | (2006.01) |
| H01L 21/306 | (2006.01) |

(52) U.S. Cl.
CPC ........ *H01L 29/785* (2013.01); *H01L 29/0665* (2013.01); *H01L 29/401* (2013.01); *H01L 29/42392* (2013.01); *H01L 29/6653* (2013.01); *H01L 29/6681* (2013.01); *H01L 29/7853* (2013.01); *H01L 21/30604* (2013.01); *H01L 2029/7858* (2013.01)

(58) Field of Classification Search
CPC .............. H01L 29/785; H01L 29/0665; H01L 29/42392; H01L 29/6653; H01L 29/6681; H01L 29/7853; H01L 29/401
See application file for complete search history.

(56) References Cited

U.S. PATENT DOCUMENTS

| | | | |
|---|---|---|---|
| 9,570,609 B2* | 2/2017 | Obradovic | ........ H01L 29/78681 |
| 9,842,914 B1 | 12/2017 | Yeung et al. | |
| 9,847,390 B1 | 12/2017 | Xie et al. | |
| 9,954,058 B1* | 4/2018 | Mochizuki | ........ H01L 29/42392 |
| 10,134,905 B2 | 11/2018 | Guillorn et al. | |
| 2015/0295084 A1* | 10/2015 | Obradovic | ............ H01L 29/517 |
| | | | 257/347 |

(Continued)

*Primary Examiner* — Christine A Enad
(74) *Attorney, Agent, or Firm* — Edward J. Wixted, III

(57) ABSTRACT

Embodiments of the invention include a method for fabricating a semiconductor device and the resulting structure. A nanosheet stack of alternating nanosheets of a sacrificial semiconductor material and a semiconductor channel material located on a substrate is provided. An additional dielectric spacer is formed on the dielectric spacer and within a gap. Dielectric spacer is removed. An epitaxial oxide layer is formed on the re-exposed recessed surfaces of the substrate. Germanium is formed on the epitaxial oxide layer. Sidewalls of each semiconductor channel material nanosheet are physically exposed. A source/drain is formed on a surface of the germanium. ILD material is formed above each source/drain and above an adjacent region. Portions of ILD material are removed such that sidewalls of the source/drain and germanium are exposed. The germanium is removed. A contact region is formed that wraps around the source/drain region.

11 Claims, 16 Drawing Sheets

(56) References Cited

U.S. PATENT DOCUMENTS

| | | |
|---|---|---|
| 2016/0204228 A1* | 7/2016 | Tapily ............... H01L 29/42392 438/151 |
| 2018/0158952 A1 | 6/2018 | Balakrishnan et al. |
| 2018/0197965 A1 | 7/2018 | Adusumilli et al. |
| 2018/0331232 A1 | 11/2018 | Frougier et al. |
| 2019/0131431 A1* | 5/2019 | Cheng ................... B82Y 10/00 |
| 2019/0214502 A1* | 7/2019 | Xu ..................... H01L 29/66742 |
| 2019/0341448 A1* | 11/2019 | Bourjot ............... H01L 29/0653 |

* cited by examiner

WRAP AROUND CONTACT FOR NANOSHEET SOURCE DRAIN EPITAXY

BACKGROUND

The present invention relates generally to the field of semiconductor devices and fabrication, and more particularly to the fabrication of a nanosheet device with a wrap-around contact around the source drain epitaxy.

The use of non-planar semiconductor devices such as, for example, semiconductor fin field effect transistors (FinFETs) is the next step in the evolution of complementary metal oxide semiconductor (CMOS) devices. One type of non-planar semiconductor device that has been touted as a viable option beyond the 7 nm technology node is a nanosheet containing device. By "nanosheet containing device" it is meant that the device contains one or more layers of semiconductor channel material portions having a vertical thickness that is substantially less than its width.

Nanosheet formation relies on the selective removal of one semiconductor material (e.g., silicon) to another semiconductor material (e.g., a silicon germanium alloy) to form suspended nanosheets for gate-all-around devices. Source/drain (S/D) regions for nanosheet containing devices are currently formed by epitaxial growth of a semiconductor material upwards from an exposed surface of the semiconductor substrate and from sidewalls of each nanosheet.

SUMMARY

Embodiments of the invention include a method for fabricating a semiconductor device and the resulting structure. The method can include providing a nanosheet stack of alternating nanosheets of a sacrificial semiconductor material nanosheet and a semiconductor channel material nanosheet located on a surface of a semiconductor substrate, wherein: a sacrificial gate structure and a dielectric spacer material layer straddle over the nanosheet stack; and the semiconductor substrate has physically exposed recessed surfaces that lay adjacent to the sacrificial gate structure and the dielectric spacer material. The method can also include recessing end portions of each of the sacrificial semiconductor material nanosheets to provide a gap between each of the semiconductor channel material nanosheets. The method can also include forming an additional dielectric spacer material layer on the dielectric spacer material layer and within each gap and on the recessed surfaces of the semiconductor substrate. The method can also include removing the additional dielectric spacer material layer from the recessed surfaces to re-expose the recessed surface. The method can also include forming an epitaxial oxide layer on the re-exposed recessed surfaces of the semiconductor substrate. The method can also include forming a germanium layer on the epitaxial oxide layer. The method can also include physically exposing sidewalls of each semiconductor channel material nanosheet. The method can also include forming source/drain regions by epitaxial growth of a semiconductor material on the physically exposed sidewalls of each semiconductor channel material nanosheet, wherein the source/drain region is present on a surface of the germanium layer. The method can also include forming an interlevel dielectric (ILD) material above each source/drain region and above an adjacent region. The method can also include removing portions of ILD material, extending into the adjacent region, to provide a trench such that sidewalls of the source/drain regions and sidewalls of the germanium layer are exposed. The method can also include removing the germanium layer. The method can also include forming a contact region in the area comprising the trench, wherein the contact region wraps around the source/drain region.

DETAILED DESCRIPTION

Figure 1:
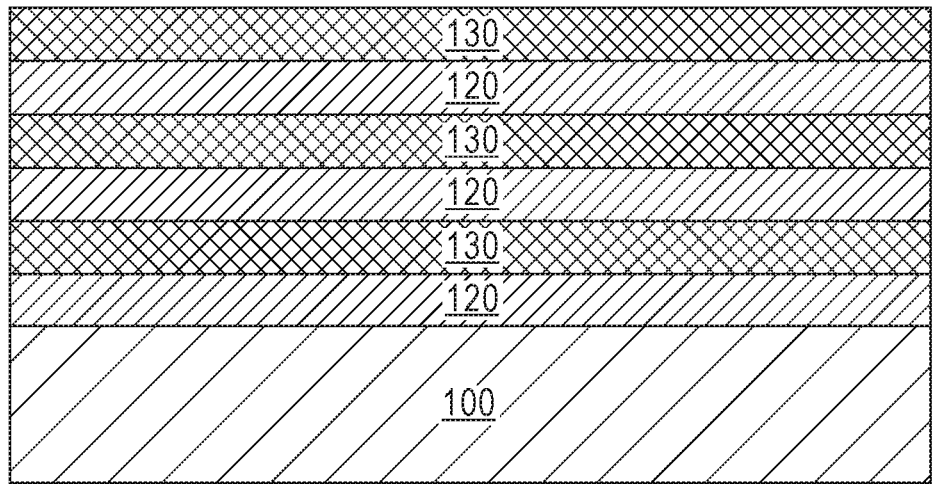
FIG. 1 depicts a semiconductor substrate and semiconductor material stack upon which embodiments of the invention can be fabricated, in accordance with an embodiment of the invention.

Embodiments of the present invention recognize that future device nodes, including 5 nanometer (nm) device scaling in transistor design may utilize nanosheets. Embodiments of the present invention recognize that nanosheet formation relies on the selective removal of one semiconductor (e.g., silicon (Si)) to another (e.g., silicon germanium (SiGe)) to form a device with nanosheets and gate-all-around. Embodiments of the present invention further recognize that, for stacked nanosheet devices, the bottom Si sheet has a higher access resistance because the current flowing to the bottom channel needs to cross the entire epitaxial source/drain region, which may have some potential voltage drop. Embodiments of the present invention recognize a need to reduce access resistance in order to improve device performance.

Embodiments of the present invention describe structures and methods for creating a wrap-around contact around the whole source/drain epitaxy, as opposed to only a top contact or a wrap around contact for each single sheet of the nanosheet stack. Embodiments of the present invention recognize that such a wrap-around contact may reduce access resistance and, therefore, improve device performance.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Each reference number may refer to an item individually or collectively as a group. For example, sacrificial gate structure 210 may refer to a single sacrificial gate structure 210 or multiple sacrificial gate structures 210.

The present invention will now be described in detail with reference to the Figures.

FIG. 1 depicts a cross-sectional view of a device at an early stage in the method of forming the device. The semiconductor structure of FIG. 1 includes a semiconductor substrate upon which embodiments of the invention can be fabricated. Semiconductor substrate 100 may be composed of a silicon containing material. Silicon containing materials include, but are not limited to, silicon, single crystal silicon, polycrystalline silicon, SiGe, single crystal SiGe, polycrystalline SiGe, or silicon doped with carbon (C), amorphous silicon, and combinations and multi-layers thereof. Semiconductor substrate 100 can also be composed of other semiconductor materials, such as germanium (Ge), and compound semiconductor substrates, such as type III/V semiconductor substrates, e.g., gallium arsenide (GaAs). In general, semiconductor substrate 100 is a smooth surface substrate. In some embodiments (not shown), semiconductor substrate 100 can be a partially processed complementary metal-oxide semiconductor (CMOS) integrated wafer with transistors and wiring levels or gate electrodes embedded beneath the surface.

In some embodiments a bottom isolation layer (not shown) is atop semiconductor substrate 100. The bottom isolation layer may be composed of silicon oxide or rare earth oxides, as known in the art.

A semiconductor material stack (120, 130) is formed upon semiconductor substrate 100, or alternatively, a bottom isolation layer. The semiconductor material stack includes vertically aligned alternating layers of sacrificial semiconductor material layer 120 and semiconductor channel material layer 130. The semiconductor material stack is sequentially formed upon semiconductor substrate 100. As mentioned above, the semiconductor material stack includes sacrificial semiconductor material layers 120 and semiconductor channel material layers 130, which alternate one atop the other. In FIG. 1, and only by way of one example, the semiconductor material stack includes three layers of sacrificial semiconductor material layer 120 and three layers of semiconductor channel material layer 130. The semiconductor material stacks that can be employed in embodiments of the present invention are not limited to the specific embodiment illustrated in FIG. 1. Instead, the semiconductor material stack can include any number of sacrificial semiconductor material layers 120 and semiconductor channel material layers 130. The semiconductor material stack is used to provide a gate-all-around device that includes vertically stacked semiconductor channel material nanosheets for a p-channel field-effect transistor (pFET) or n-channel field-effect transistor (nFET) device.

Each sacrificial semiconductor material layer 120 is composed of a first semiconductor material which differs in composition from at least an upper portion of semiconductor substrate 100 and, if present, the bottom isolation layer. In one embodiment, the upper portion of the semiconductor substrate 100 is composed of silicon, while each sacrificial semiconductor material layer 120 is composed of silicon germanium. In such an embodiment, the silicon germanium alloy content of sacrificial semiconductor material layer 120 may have a germanium content that is less than 50 atomic percent germanium. In one example, the SiGe alloy that makes up sacrificial semiconductor material layer 120 has a germanium content from 20 atomic percent germanium to 40 atomic percent germanium. The first semiconductor material, for each sacrificial semiconductor material layer 120, can be formed utilizing an epitaxial growth or deposition process.

Each semiconductor channel material layer 130 is composed of a second semiconductor material that has a different etch rate than the first semiconductor material of sacrificial semiconductor material layers 120. The second semiconductor material of each semiconductor channel material layer 130 may be the same as, or different than, the semiconductor material of, at least, the upper portion of semiconductor substrate 100. The second semiconductor material can be, for example, silicon. The second semiconductor material can be a SiGe alloy having a germanium content of 20-50 atomic percent germanium and the first semiconductor material is different than the second semiconductor material.

In one example, at least the upper portion of semiconductor substrate 100 and each semiconductor channel material layer 130 is composed of Si or a III-V compound semiconductor, while each sacrificial semiconductor material layer 120 is composed of a SiGe alloy. The second semiconductor material, for each semiconductor channel material layer 130, can be formed utilizing an epitaxial growth or deposition process.

Semiconductor material stack (120, 130) can be formed by sequential epitaxial growth of alternating layers of the first semiconductor material and the second semiconductor material. Following epitaxial growth of the topmost layer of the semiconductor material stack (120, 130) a patterning process may be used to provide the semiconductor material stack (120, 130) shown in FIG. 1. Patterning may be achieved by lithography and etching as is well known to those skilled in the art.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth the first and second semiconductor materials that provide the sacrificial semiconductor material layers and the semiconductor channel material layers, respectively, can be performed utilizing any well-known precursor gas or gas mixture. Carrier gases like hydrogen, nitrogen, helium and argon can be used.

The sacrificial semiconductor material layers 120 that constitutes the semiconductor material stack may have a thickness from 5 nm to 12 nm, while the semiconductor channel material layers 130 that constitute the semiconductor material stack may have a thickness from 6 nm to 12 nm. Each sacrificial semiconductor material layer 120 may have a thickness that is the same as, or different from, a thickness of each semiconductor channel material layer 130. In an embodiment, each sacrificial semiconductor material layer 120 has an identical thickness. In an embodiment, each semiconductor channel material layer 130 has an identical thickness.

Figure 2:
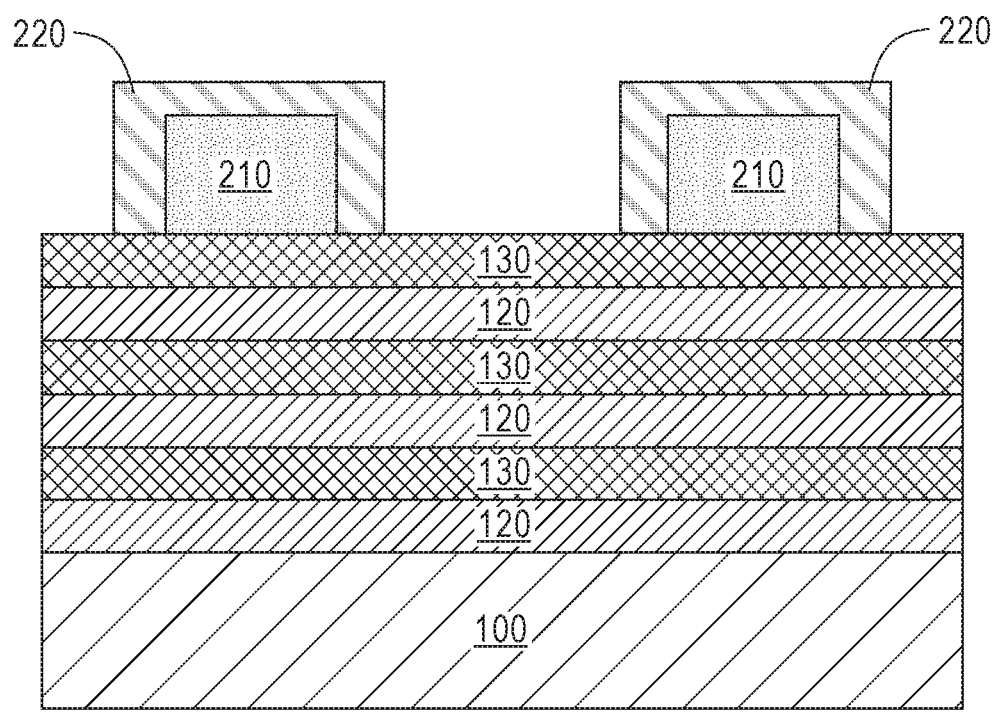
FIG. 2 depicts a process of forming a dummy gate and gate spacer upon the semiconductor material stack, in accordance with an embodiment of the invention.

FIG. 2 depicts a cross-sectional view of fabrication steps, in accordance with an embodiment of the present invention. FIG. 2 shows the formation of sacrificial gate structures 210 and dielectric spacer material layers 220. By way of illustration, two sacrificial gate structures 210 are depicted in the drawings of the present application. Each sacrificial gate structure 210 is located on a first side and a second side of the semiconductor material stack (120,130) and spans across a topmost surface of a portion of the semiconductor material stack (120, 130). Each sacrificial gate structure 210 thus straddles over a portion of the semiconductor material stack (120, 130). The dielectric spacer material layer 220 is present on sidewalls and a topmost surface of each sacrificial gate structure 210; the dielectric spacer material layer 220 thus also straddles over the semiconductor material stack (120, 130).

It is noted that in the drawings, the sacrificial gate structures 210 and dielectric spacer material layer 220 are only shown as being present atop, not along sidewalls, of the semiconductor material stack (120, 130). This was done for clarity and to illustrate the nanosheet stack that will be subsequently formed beneath the sacrificial gate structures 16 and the dielectric spacer material layer 18.

Each sacrificial gate structure 210 may include a single sacrificial material portion or a stack of two or more sacrificial material portions (i.e., at least one sacrificial material portion). In one embodiment, the at least one sacrificial material portion comprises, from bottom to top, a sacrificial gate dielectric portion, a sacrificial gate portion and a sacrificial dielectric cap portion. In some embodiments, the sacrificial gate dielectric portion and/or the sacrificial dielectric cap portion can be omitted and only a sacrificial gate portion is formed. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition (ALD).

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition (CVD) or plasma enhanced chemical vapor deposition (PECVD).

After providing the above mentioned sacrificial material stack (or any subset of the sacrificial materials), lithography and etching can be used to pattern the sacrificial material stack (or any subset of the sacrificial materials) and to provide the at least one sacrificial gate structure 210. The remaining portions of the sacrificial gate dielectric material constitute a sacrificial gate dielectric portion, the remaining portions of the sacrificial gate material constitute a sacrificial gate portion, and the remaining portions of the sacrificial dielectric cap material constitute a sacrificial dielectric cap portion.

After providing the sacrificial gate structure 210, the dielectric spacer material layer 220 can be formed on exposed surfaces of each sacrificial gate structure 210. The dielectric spacer material layer 220 can be formed by first providing a dielectric spacer material and then etching the dielectric spacer material. One example of a dielectric spacer material that may be employed in the present application is silicon nitride. In general, the dielectric spacer material layer 220 comprises any dielectric spacer material, including, for example, a dielectric nitride, dielectric oxide, and/or dielectric oxynitride. More specifically, the dielectric spacer material layer 220 may be, for example, SiBCN, SiBN, SiOCN, SiON, SiCO, or SiC. In one example, the dielectric spacer material is composed of a non-conductive low capacitance dielectric material such as $SiO_2$.

The dielectric spacer material that provides the dielectric spacer material layer 220 may be provided by a deposition process including, for example, chemical vapor deposition (CVD), plasma enhanced chemical vapor deposition (PECVD), or physical vapor deposition (PVD). The etch used to provide the dielectric spacer material layer 220 may comprise a dry etching process such as, for example, reactive ion etching.

Figure 3A:
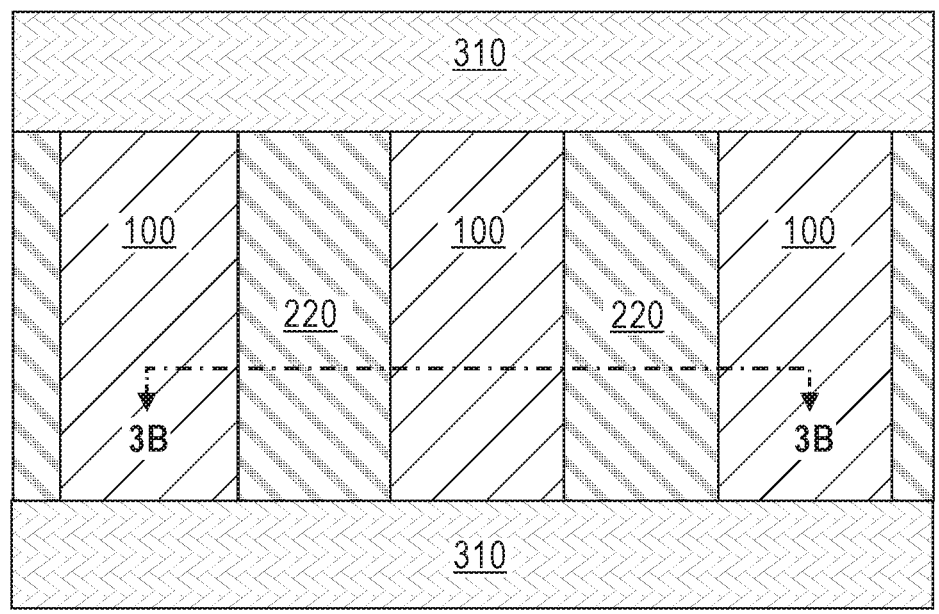
FIG. 3A depicts a top view of a process of forming a recess within the semiconductor material stack, in accordance with an embodiment of the invention.
Figure 3B:
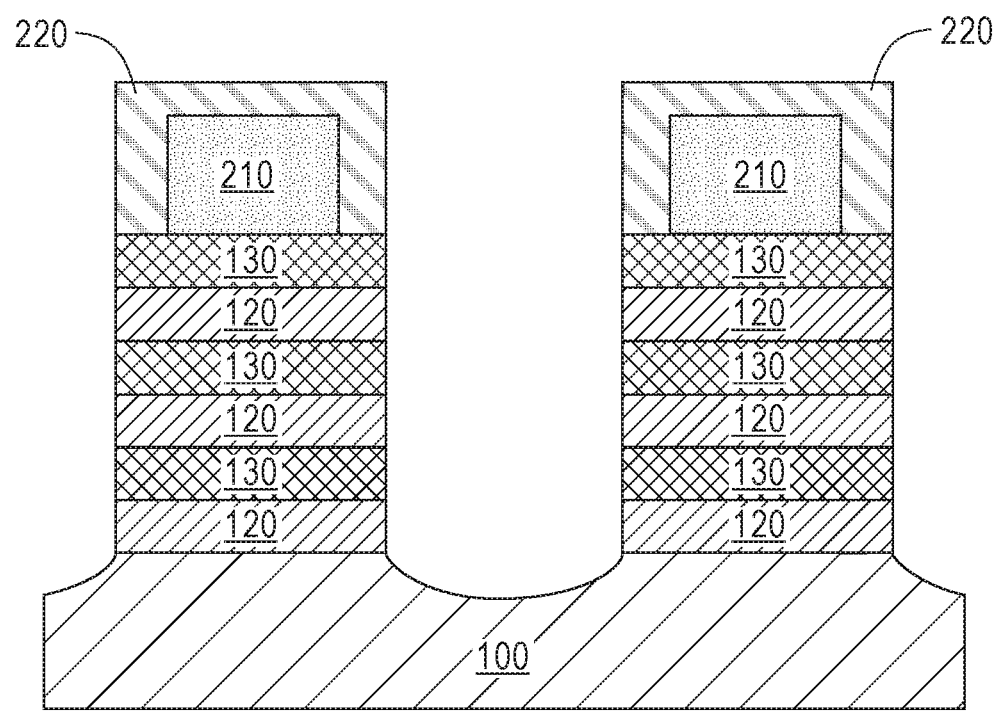
FIG. 3B depicts a cross-sectional view, along section line 3B of FIG. 3A, in accordance with an embodiment of the invention.

FIG. 3A depicts a top view and FIG. 3B depicts a cross-sectional view, along section line 3B of FIG. 3A, of fabrication steps, in accordance with an embodiment of the present invention. FIGS. 3A and 3B show the formation of recesses within the semiconductor material stack and the formation of nanosheet stacks of alternating nanosheets of sacrificial semiconductor material layers 120 and semiconductor channel material layers 130 that are under at least one sacrificial gate structure 210 and dielectric spacer material layer 220.

The nanosheet stack is formed by removing physically exposed portions of the semiconductor stack (120, 130) that are not protected by the least one sacrificial gate structure 210 and the dielectric spacer material layer 220. During this step of embodiments of the present invention, a portion of the semiconductor substrate 100 may also be removed, i.e., recessed, to provide a recessed surface. In such an embodiment, the recessed surface of the semiconductor substrate 100 may be a concave surface. In general, each recess may include the eventual location of a source/drain epitaxy, such as source/drain region 1010 (see subsequent Figures), for the semiconductor device.

The removing of the portions of the semiconductor material stack (120, 130) not covered by the least one sacrificial gate structure 210 and the dielectric spacer material layer 220 can be performed utilizing an anisotropic etching process such as, for example, reactive ion etching (RIE). Portions of the semiconductor material stack (120, 130) remain beneath the least one sacrificial gate structure 210 and the dielectric spacer material layer 220. The remaining portion of the semiconductor material stack that is presented beneath the least one sacrificial gate structure 210 and the dielectric spacer material layer 220 is referred to as a nanosheet stack.

Each nanosheet stack includes alternating nanosheets of remaining portions of each sacrificial semiconductor material layer 120 and remaining portions of each semiconductor channel material layer 130. The nanosheet stack includes alternating nanosheets of remaining portions of each of sacrificial semiconductor material layer 120 and semiconductor channel material layer 130. Each nanosheet (i.e., sacrificial semiconductor material layer 120 or semiconductor channel material layer 130) that constitutes the nanosheet stack has a thickness as mentioned above for the individual sacrificial semiconductor material layers 120 and semiconductor channel material layers 130, and a width from 30 nm to 200 nm. In some embodiments, as illustrated in FIG. 3B, the sidewalls of each sacrificial semiconductor material layer 120 are vertically aligned to sidewalls of each semiconductor channel material layer 130, and the vertically aligned sidewalls of the nanosheet stack are vertically aligned to an outmost sidewall of dielectric spacer material layer 220.

FIG. 3A also illustrates shallow trench isolation (STI) material 310 formed in an adjacent region to an active region, the active region being the area depicted by FIG. 3A that includes: (i) semiconductor substrate 100 and (ii) the stacks of sacrificial semiconductor material layer 120 and semiconductor channel material layer 130, which is beneath dielectric spacer material layer 220. The STI material 310 can be located in the region outside of the active region, hereinafter referred to as the "adjacent region." The STI material 310 can be formed by any suitable process including, for example, lithography or etching, to form trenches, and then filling the trenches with an insulating (dielectric) material, such as silicon dioxide. Following the deposition of STI material 310, an additional etching process can be performed to remove portions of STI material 310 and expose the active region.

Figure 4A:
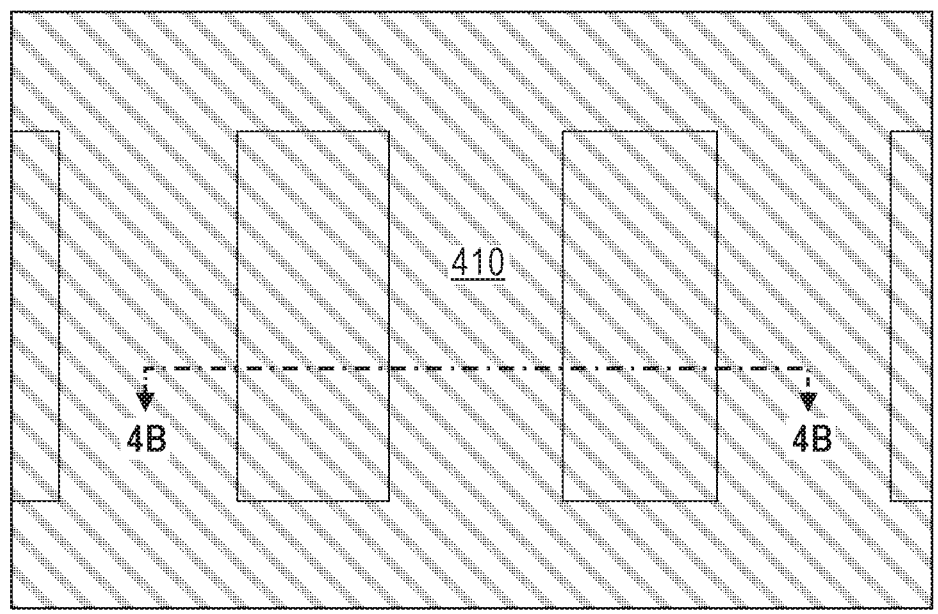
FIG. 4A depicts a top view of a process of forming a liner recessing sacrificial semiconductor material layer 120, in accordance with an embodiment of the invention.
Figure 4B:
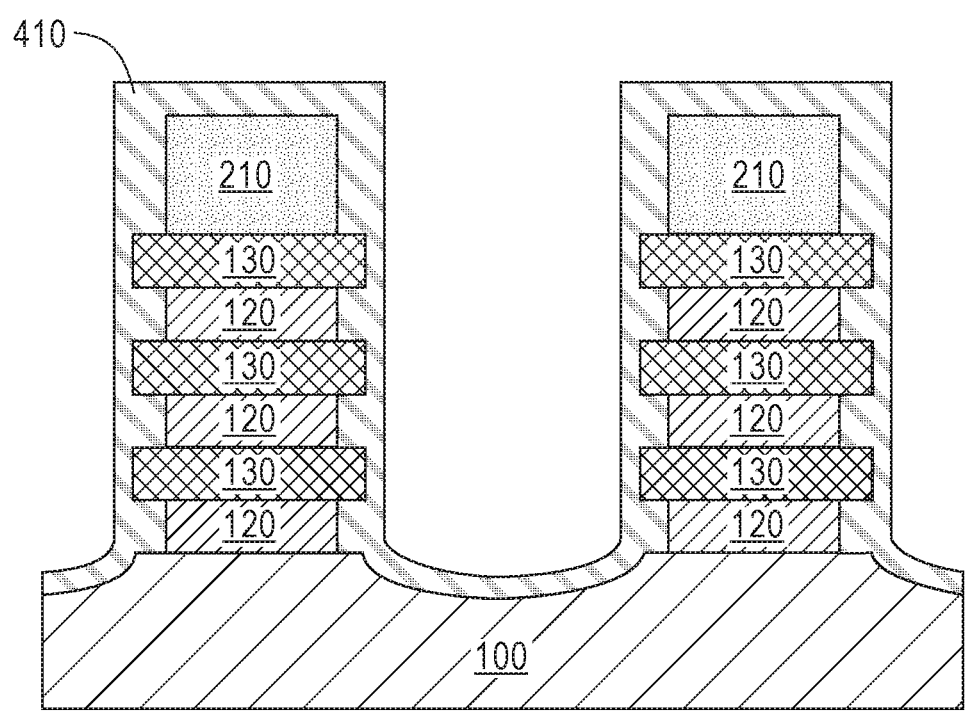
FIG. 4B depicts a cross-sectional view, along section line 4B of FIG. 4A, in accordance with an embodiment of the invention.

FIG. 4A depicts a top view and FIG. 4B depicts a cross-sectional view, along section line 4B of FIG. 4A, of fabrication steps, in accordance with an embodiment of the present invention. FIGS. 4A and 4B depict the recessing of sacrificial semiconductor material layer 120 and formation of dielectric gate spacer material layer 410.

Each recessed sacrificial semiconductor material layer 120 has a width that is less than the original width of each sacrificial semiconductor material layer 120 (see FIG. 3B). The recessing of each sacrificial semiconductor material layer 120 provides a gap (not specifically shown) between each neighboring pair of semiconductor channel material layer 130 within a given nanosheet stack. The recessing of each sacrificial semiconductor material layer 120 may be performed utilizing a lateral etching process that is selective in removing physically exposed end portions of each sacrificial semiconductor material layer 120 relative to each semiconductor channel material layer 130.

The additional dielectric spacer material that is added is compositionally the same as the dielectric spacer material layer 220 mentioned above. In one example, the additional dielectric spacer material and the dielectric spacer material layer 220 are both composed of silicon nitride. For clarity, the additional dielectric spacer material and the dielectric spacer material layer 220 can now be referred to as dielectric gate spacer material layer 410. It is noted that the additional dielectric spacer material forms on the physically exposed surfaces of the dielectric spacer material layer 220 and within each gap created by the recessing of each sacrificial semiconductor material layer 120. The additional dielectric spacer material can be formed utilizing one of the deposition processes mentioned above in forming the dielectric spacer material layer 220.

Figure 5A:
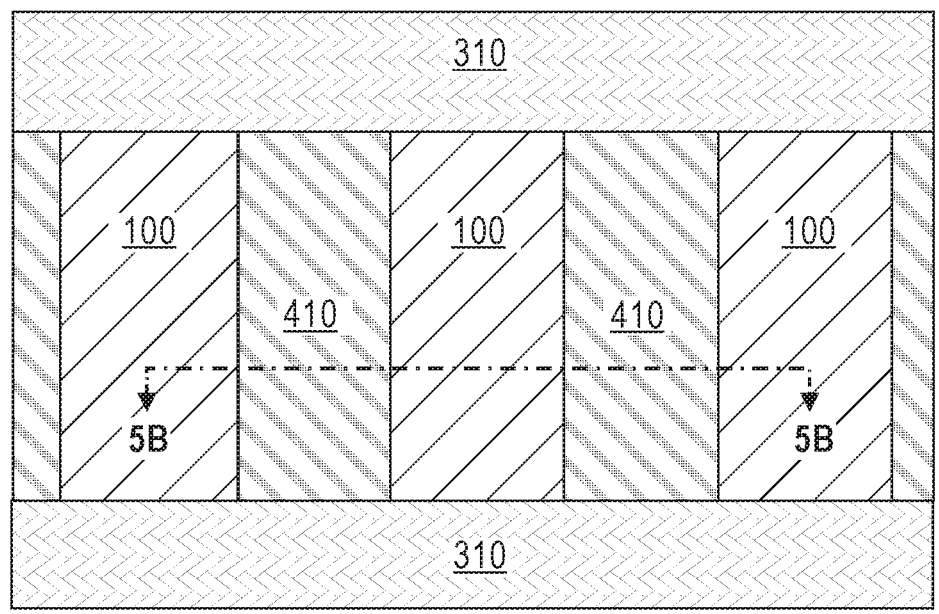
FIG. 5A depicts a top view of a process of removing a portion of the liner that was adjacent to the semiconductor substrate, in accordance with an embodiment of the invention.
Figure 5B:
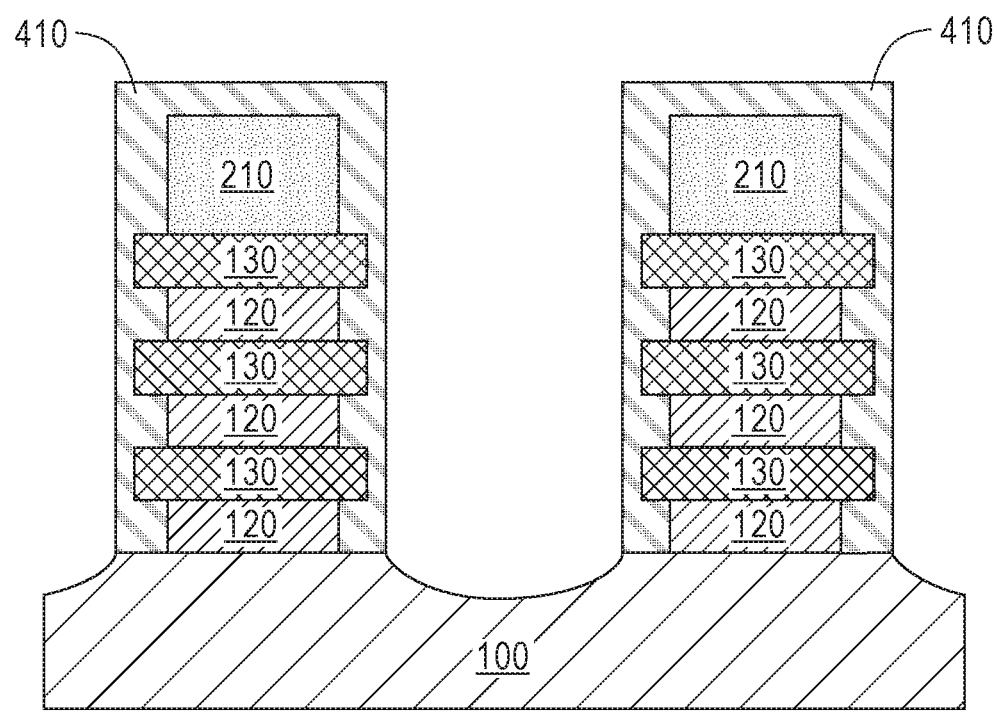
FIG. 5B depicts a cross-sectional view, along section line 5B of FIG. 5A, in accordance with an embodiment of the invention.

FIG. 5A depicts a top view and FIG. 5B depicts a cross-sectional view, along section line 5B of FIG. 5A, of fabrication steps, in accordance with an embodiment of the present invention. FIGS. 5A and 5B depict the removal of the bottom portion of dielectric gate spacer material layer 410 from the recessed surface of the semiconductor substrate 100. The dielectric gate spacer material layer 410 may be removed from the recessed surface of the semiconductor substrate 100 utilizing a directional etching process. In one example, gas cluster ion beam etching may be used to remove the dielectric gate spacer material layer 410 from the recessed surface of the semiconductor substrate 100. The removal of the dielectric gate spacer material layer 410 from the recessed surface of the semiconductor substrate 100 re-exposes the recessed surface of the semiconductor substrate 100. In the illustrated embodiment of FIG. 5, the concave surface is re-exposed.

Figure 6A:
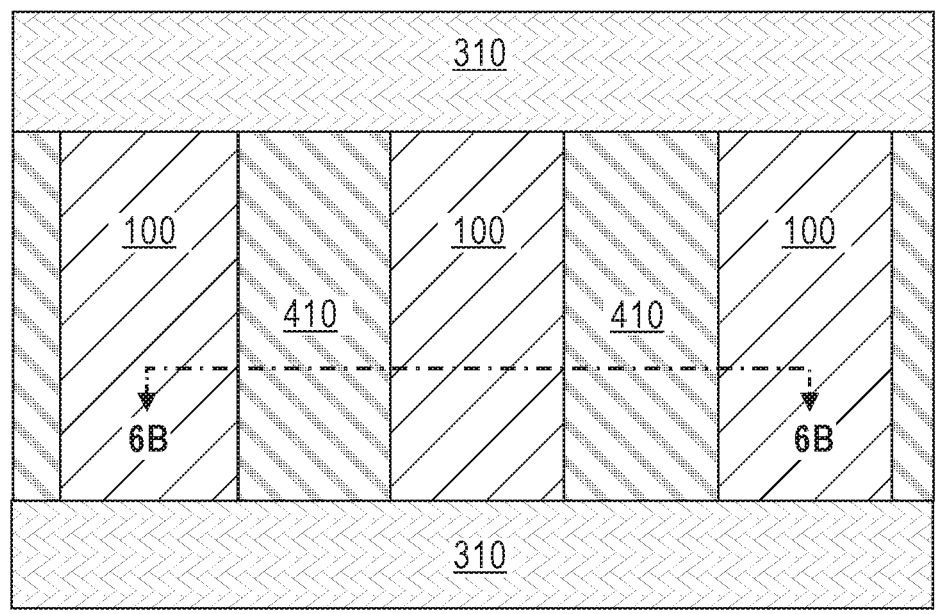
FIG. 6A depicts a top view of the formation of a recess into the semiconductor substrate, in accordance with an embodiment of the invention.
Figure 6B:
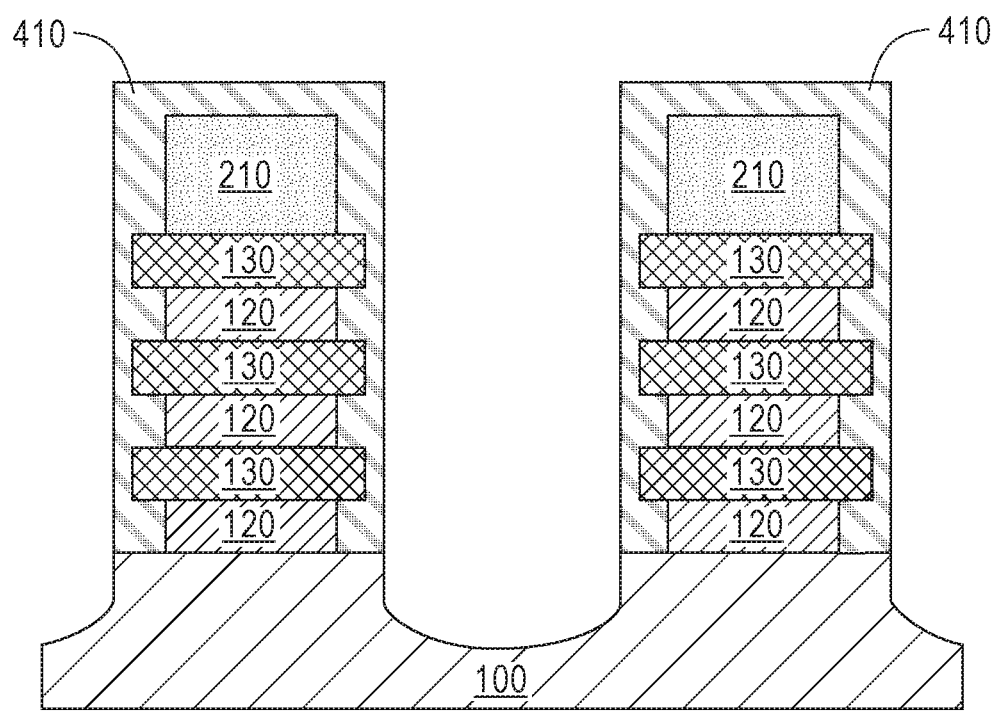
FIG. 6B depicts a cross-sectional view, along section line 6B of FIG. 6A, in accordance with an embodiment of the invention.

FIG. 6A depicts a top view and FIG. 6B depicts a cross-sectional view, along section line 6B of FIG. 6A, of fabrication steps, in accordance with an embodiment of the present invention. FIGS. 6A and 6B depict the creation of a second recessing of the semiconductor substrate 100. In some embodiments, this step is optional. The second recess may provide semiconductor substrate 10 with another concave surface.

The second recessing may be performed utilizing an etching process such as, for example, reactive ion etching (RIE). No etching/recessing of the recessed sacrificial semiconductor material layer 120 and the semiconductor channel material layer 130 within a given nanosheet stack is observed since the same are protected by the sacrificial gate structure 210 and a portion of the dielectric gate spacer material layer 410.

Figure 7A:
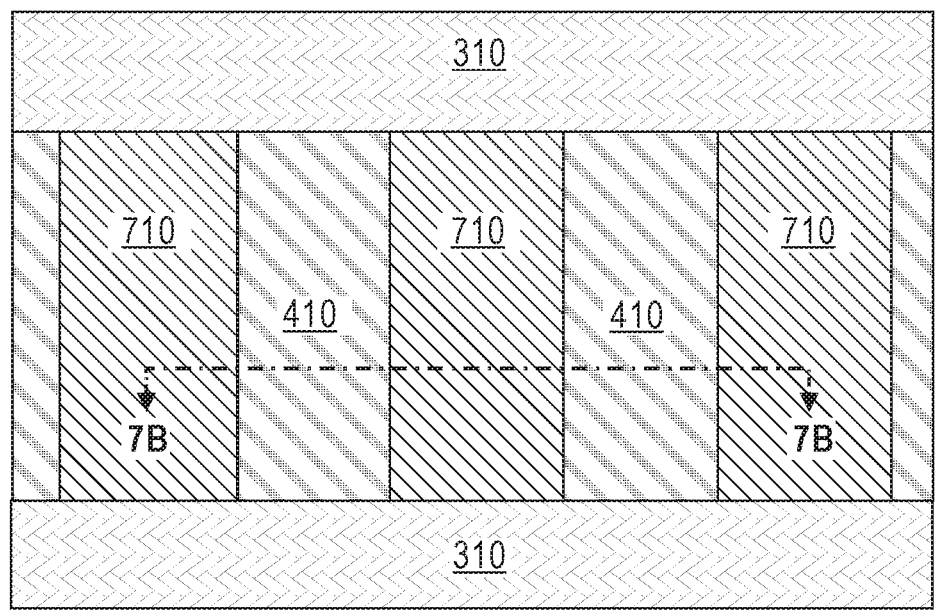
FIG. 7A depicts a top view of the formation of an epitaxial oxide layer on exposed portions of the semiconductor substrate, in accordance with an embodiment of the invention.
Figure 7B:
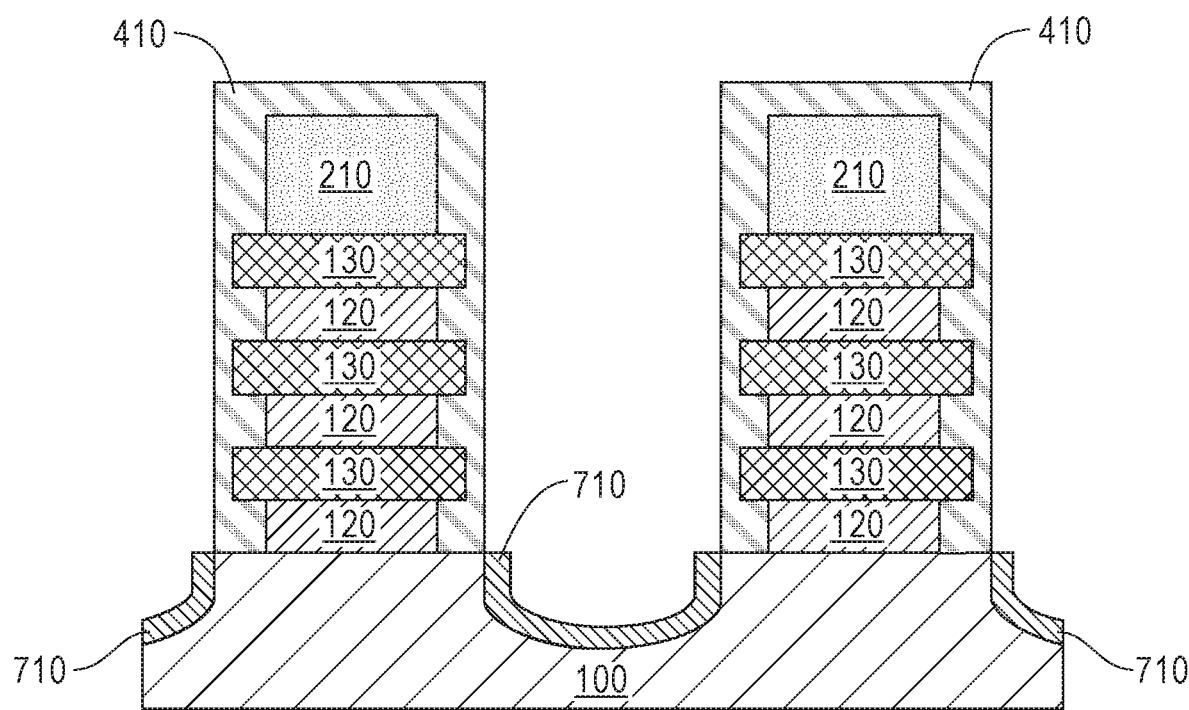
FIG. 7B depicts a cross-sectional view, along section line 7B of FIG. 7A, in accordance with an embodiment of the invention.

FIG. 7A depicts a top view and FIG. 7B depicts a cross-sectional view, along section line 7B of FIG. 7A, of fabrication steps, in accordance with an embodiment of the present invention. FIGS. 7A and 7B depict the formation of epitaxial oxide 710 on exposed portions of semiconductor substrate 100.

The epitaxial oxide 710 is composed of an oxide of at least one rare earth metal. Rare earth metals that can be used herein as a component of the lattice matched epitaxial oxide interlayers include scandium, yttrium, a lanthanide (i.e., La, Ce, Pr, Nd, Pm, Sm, Eu, Gd, Tb, Dy, Ho, Er, Tm, Yb, and Lu), or any combination thereof.

In one embodiment, the oxide of at least one rare earth metal that may provide the epitaxial oxide 710 is a binary compound. In another embodiment, the oxide of at least one rare earth metal that may provide the epitaxial oxide 710 is a ternary compound. Examples of oxides of at least one rare earth metal that can be used to provide the epitaxial oxide 710 include, but are not limited to, $(La_xY_{1-x})_2O_3$ wherein x is 0.33 $Gd_2O_3$, $Er_2O_3$, $Dy_2O_3$, $Ho_2O_3$, $Tm_2O_3$, $Lu_2O_3$ and $CeO_2$. In addition to $(La_xY_{1-x})_2O_3$, other ternary compounds having the formula $(RE^1_xRE^2_{1-x})_2O_3$ wherein $RE^1$ is a first rare earth metal and $RE^2$ is a second rare earth metal that differs from the first rare earth metal can be used.

In one example, the epitaxial oxide 710 is lanthanum (La) and oxygen (O) containing material, which has a lattice dimension that can be closely matched to a silicon lattice. In one embodiment, the epitaxial oxide 710 is lanthanum (La) and oxygen (O) containing material, e.g., $(La_xY_{1-x})_2O_3$ alloy, and may be epitaxially deposited.

The terms "epitaxial growth," "epitaxial deposition," "epitaxially formed," and/or "epitaxially grown" mean the growth of a material (e.g., semiconductor material) on a deposition surface of a material, in which the material being grown has substantially the same crystalline characteristics as the material of the deposition surface. The term "epitaxial material" denotes a semiconductor material that has substantially the same crystalline characteristics as the semiconductor material that it has been formed on, i.e., epitaxially formed on. In an epitaxial deposition process, the chemical reactants provided by the source gases are controlled and the system parameters are set so that the depositing atoms arrive at the deposition surface of the growth surface with sufficient energy to move around on the surface and orient themselves to the crystal arrangement of the atoms of the deposition surface. Therefore, an epitaxial material has the same crystalline characteristics as the deposition surface on which it is formed. For example, an epitaxial film deposited on a {100} crystal surface, e.g., the epitaxial oxide, will take on a {100} orientation.

Epitaxial growth process apparatuses that are suitable for use in forming the epitaxial oxide 710 are molecular beam epitaxy (MBE), but other methods like rapid thermal chemical vapor deposition (RTCVD), low-energy plasma deposition (LEPD), ultra-high vacuum chemical vapor deposition (UHVCVD), atmospheric pressure chemical vapor deposition (APCVD) may be used. The temperature for epitaxial deposition typically ranges from 450° C. to 900° C. Although higher temperature typically results in faster deposition, the faster deposition may result in crystal defects and film cracking.

A number of different sources may be used for the deposition of the lattice matched epitaxial oxide 710. In some embodiments, e.g., when the epitaxial oxide 710 is composed of a lanthanum and oxygen containing material, e.g., metastable $(La_xY_{1-x})_2O_3$ alloy, the epitaxial oxide 710 may be formed using MBE deposition, using La and Y metals with added oxygen. In MBE, material is sublimated (or evaporated in the case of a liquid source) from effusion cells, thus forming molecular beams that are incident upon a heated sample, i.e., deposition surface. In MBE, the molecules of the deposited material land on the surface of the substrate, condense, and build up slowly and systematically, i.e., providing epitaxial growth.

In some embodiments, the epitaxial oxide 710 is deposited on the concave and exposed surface of semiconductor substrate 100. In the embodiment depicted in FIGS. 7A and 7B, the upper surface of epitaxial oxide 710 is substantially coplanar with the upper surface of semiconductor substrate 100 (i.e., the upper surface of semiconductor substrate 100 that is external to the concave surface).

Figure 8A:
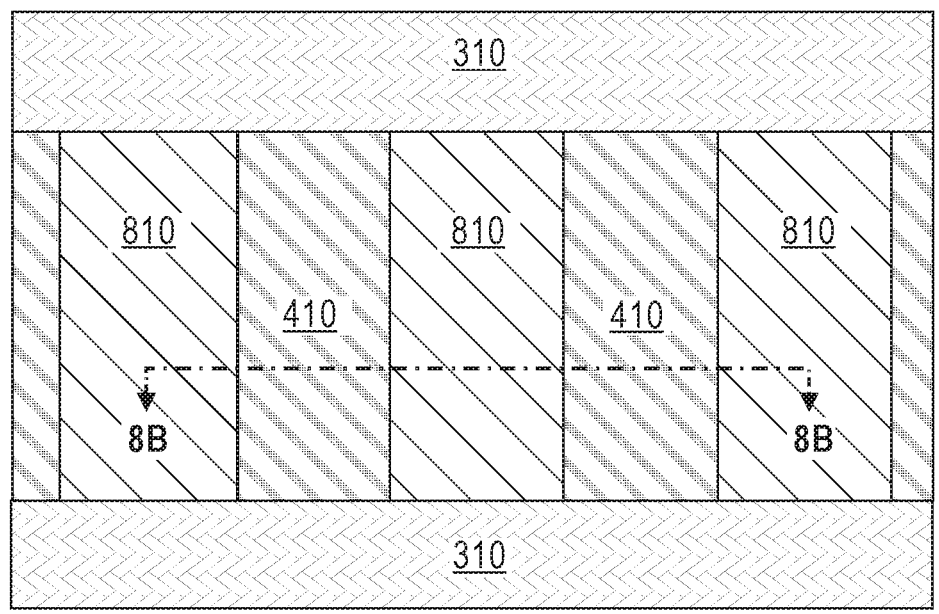
FIG. 8A depicts a top view of the formation of a germanium layer on the epitaxial oxide layer, in accordance with an embodiment of the invention.
Figure 8B:
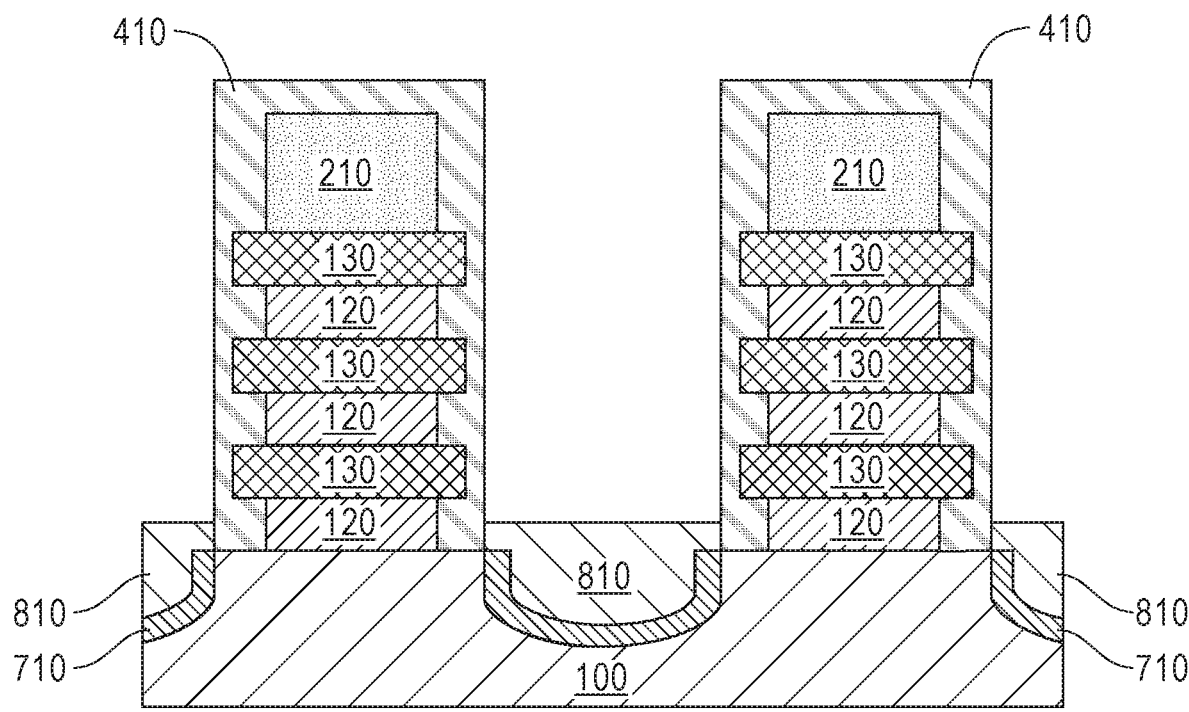
FIG. 8B depicts a cross-sectional view, along section line 8B of FIG. 8A, in accordance with an embodiment of the invention.

FIG. 8A depicts a top view and FIG. 8B depicts a cross-sectional view, along section line 8B of FIG. 8A, of fabrication steps, in accordance with an embodiment of the present invention. FIGS. 8A and 8B depict the formation of germanium (Ge) layer 810. Ge layer 810 is selectively grown on the exposed portions of epitaxial oxide 710, in accordance with an embodiment of the present invention. In some embodiments, Ge layer 810 is deposited such Ge layer 810 fills the recess above the concave surface of epitaxial oxide 710 and extends above that recess a thickness of approximately 6 nm (e.g., GE layer 810 has a thickness of approximately 6 nm above the top surface of epitaxial oxide 710 that is laterally adjacent to dielectric gate spacer material layer 410.

Ge layer 810 can be formed using an epitaxial growth (or deposition process) as defined above, such as, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The presence of a dielectric material, such as dielectric gate spacer material layer 410 and STI material 310, prevents Ge layer 810 from being formed at regions external to the growth depicted in FIGS. 8A and 8B. Accordingly, in the depicted embodiment, Ge layer 810 is formed selectively only on the exposed portions of epitaxial oxide 710.

Figure 9A:
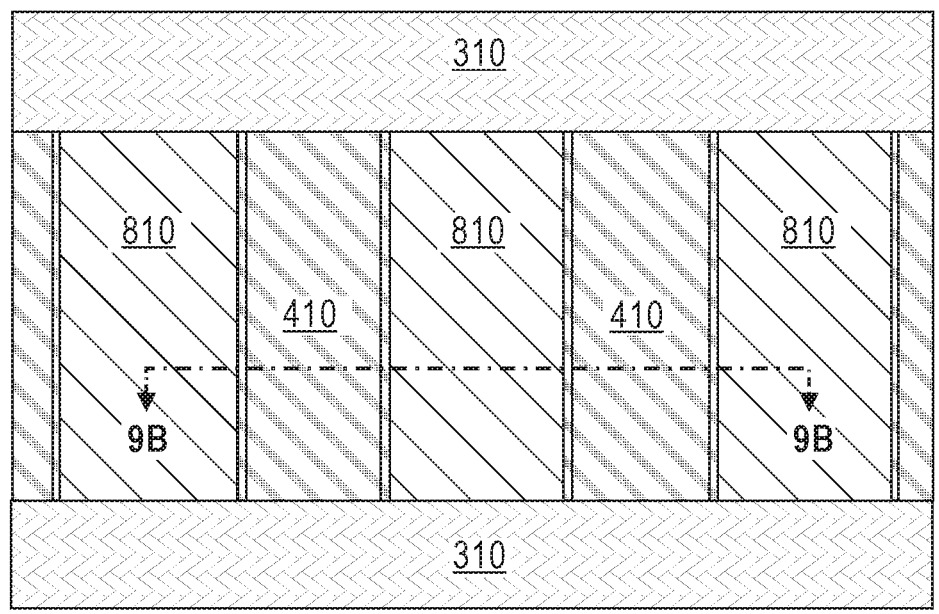
FIG. 9A depicts a top view of the removal of the liner in a lateral direction such that semiconductor channel material layers are laterally exposed, in accordance with an embodiment of the invention.
Figure 9B:
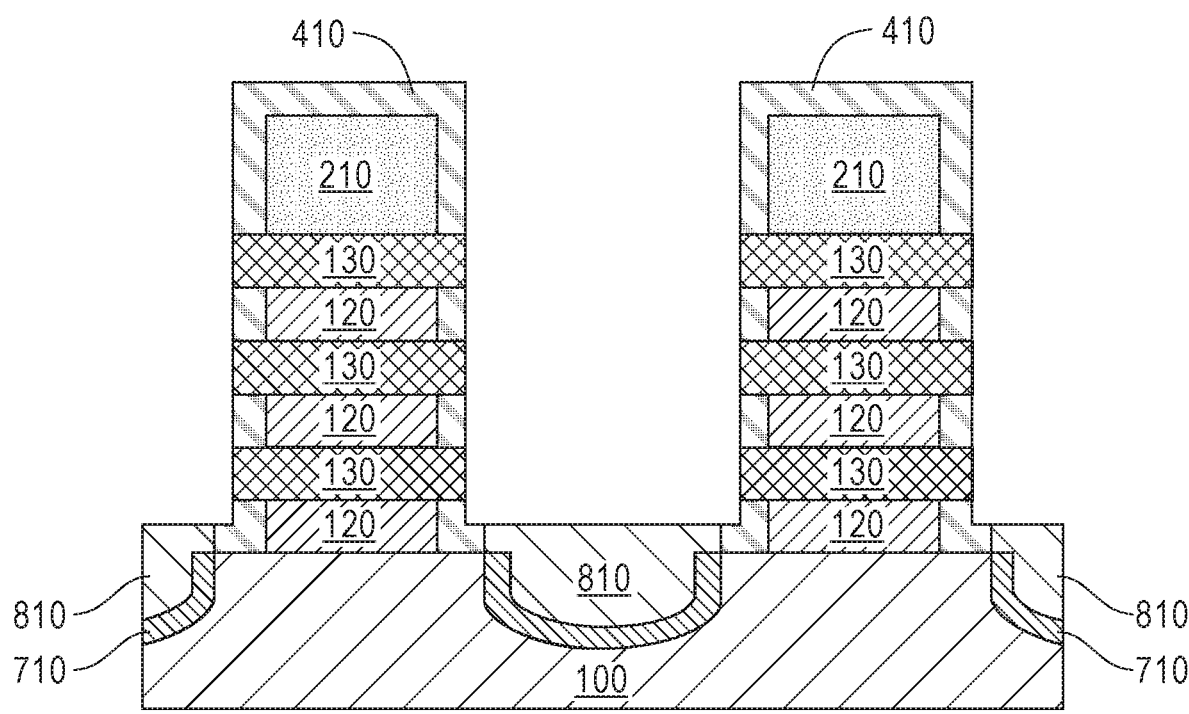
FIG. 9B depicts a cross-sectional view, along section line 9B of FIG. 9A, in accordance with an embodiment of the invention.

FIG. 9A depicts a top view and FIG. 9B depicts a cross-sectional view, along section line 9B of FIG. 9A, of fabrication steps, in accordance with an embodiment of the present invention. FIGS. 9A and 9B depict the removal of dielectric gate spacer material layer 410, in a lateral direction, such that semiconductor channel material layers are laterally exposed and inner gate spacers are formed. The inner gate spacers (i.e., the portions of dielectric gate spacer material layer 410 that are laterally adjacent to sacrificial semiconductor material layer 120) are formed in the gaps created during the formation of each recessed sacrificial semiconductor material layer 120. The formation of the inner gate spacers can be performed utilizing a material removal process such, as for example, etching. The inner gate spacers comprise a non-etched portion of the dielectric gate spacer material layer 410 that remains in each of the gaps. In some embodiments, a hot phosphoric nitride etch may be used. A hot phosphoric nitride etch process may result in a possible 10-15 angstrom (A) loss in Ge layer 810, as there may be atmospheric oxidation and/or dissolution caused by any wet process. As recited above, Ge layer 810 initially has a thickness, above epitaxial oxide 710 and laterally adjacent to dielectric gate spacer material layer 410, of about 6 nm.

Figure 10A:
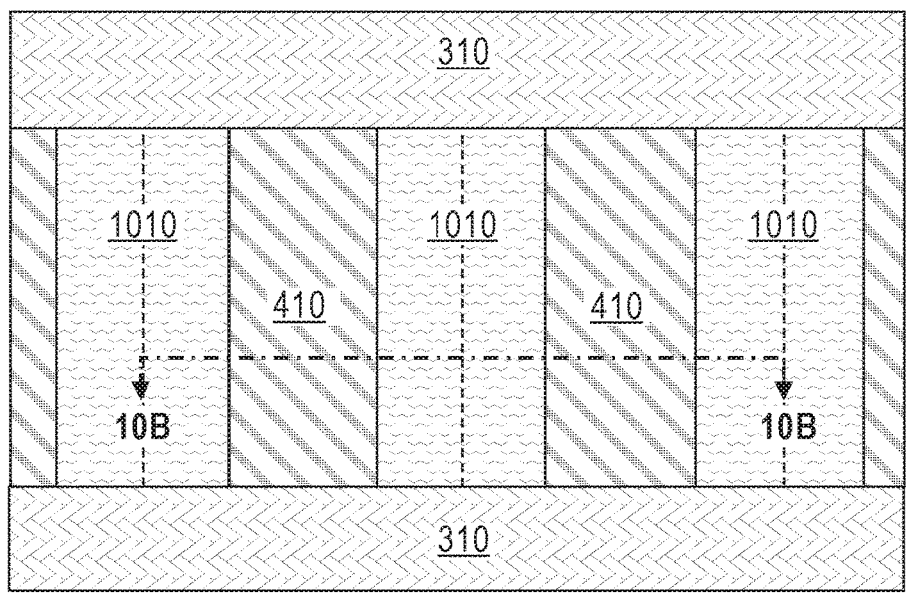
FIG. 10A depicts a top view of the formation of a source/drain region, in accordance with an embodiment of the invention.
Figure 10B:
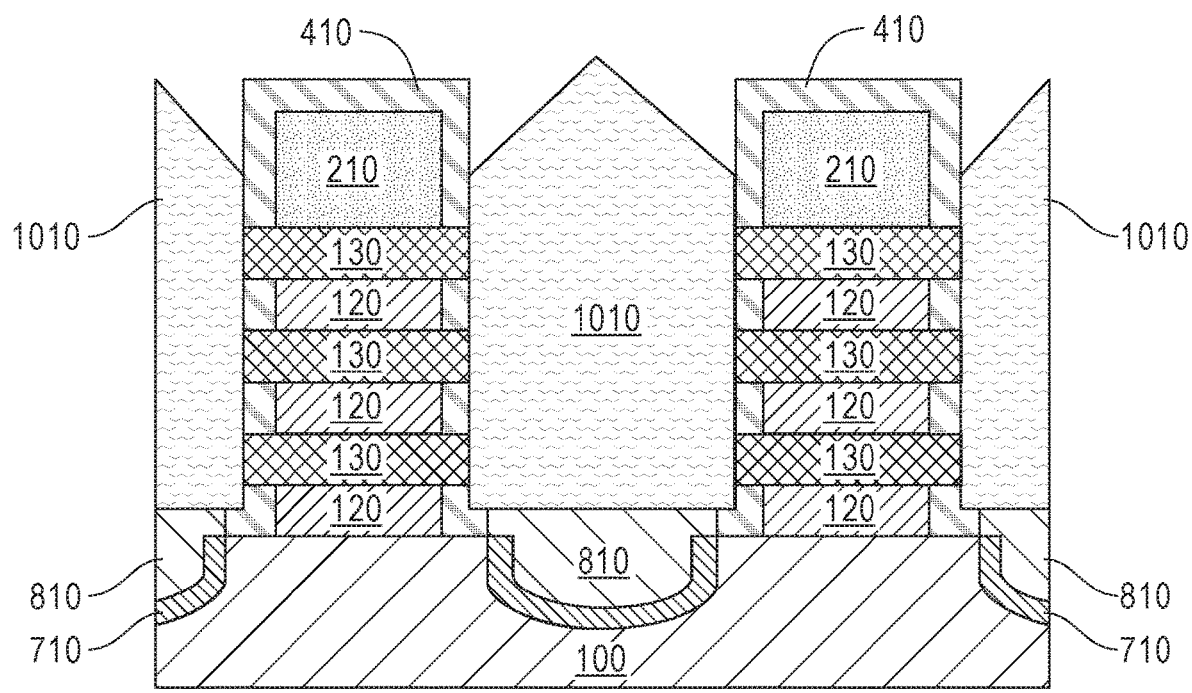
FIG. 10B depicts a cross-sectional view, along section line 10B of FIG. 10A, in accordance with an embodiment of the invention.

FIG. 10A depicts a top view and FIG. 10B depicts a cross-sectional view, along section line 10B of FIG. 10A, of fabrication steps, in accordance with an embodiment of the present invention. FIGS. 10A and 10B depict the formation of source/drain region 1010 on Ge layer 810 and along the sidewalls of each nanosheet stack.

Source/drain region 1010 is formed by epitaxial growth of a semiconductor material on physically exposed sidewalls of each semiconductor channel material layer 130. In the present application, the semiconductor material that provides the source/drain region 1010 grows laterally out from the sidewalls of each semiconductor channel material layer 130. The source/drain region 1010 has a bottommost surface that directly contacts a topmost surface of Ge layer 810. In some embodiments, each source/drain region 1010 has a faceted upper surface.

Each source/drain region 1010 includes a semiconductor material and a dopant. The semiconductor material that provides each source/drain region 1010 can be selected from one of the semiconductor materials mentioned above for the semiconductor substrate 100. In some embodiments, the semiconductor material that provides each source/drain region 1010 may comprise a same semiconductor material as that which provides semiconductor channel material layer 130. In other embodiments, the semiconductor material that provides each source/drain region 1010 may comprise a different semiconductor material than that which provides semiconductor channel material layer 130. For example, the semiconductor material that provides each source/drain region 1010 may comprise a silicon germanium alloy, which semiconductor channel material layer 130 may comprise silicon.

The dopant that is present in each source/drain region 1010 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one embodiment, the dopant that can be present in the each source/drain region 1010 can be introduced into the precursor gas that provides each source/drain region 1010. In another embodiment, the dopant can be introduced into an intrinsic semiconductor layer by utilizing one of ion implantation or gas phase doping. In one example, each source/drain region 1010 comprises a silicon germanium alloy that is doped with a p-type dopant such as, for example, boron. As mentioned above, each source/drain region 1010 is formed by an epitaxial growth (or deposition) process, as is defined above.

Figure 11A:
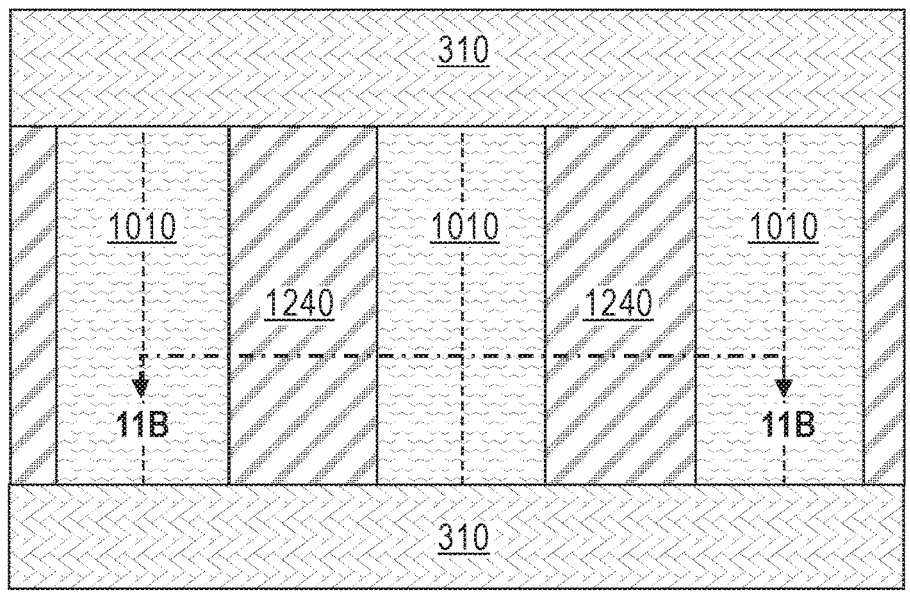
FIG. 11A depicts a top view of the formation of interlevel dielectric (ILD) material and the formation of a functional gate structure, in accordance with an embodiment of the invention.
Figure 11B:
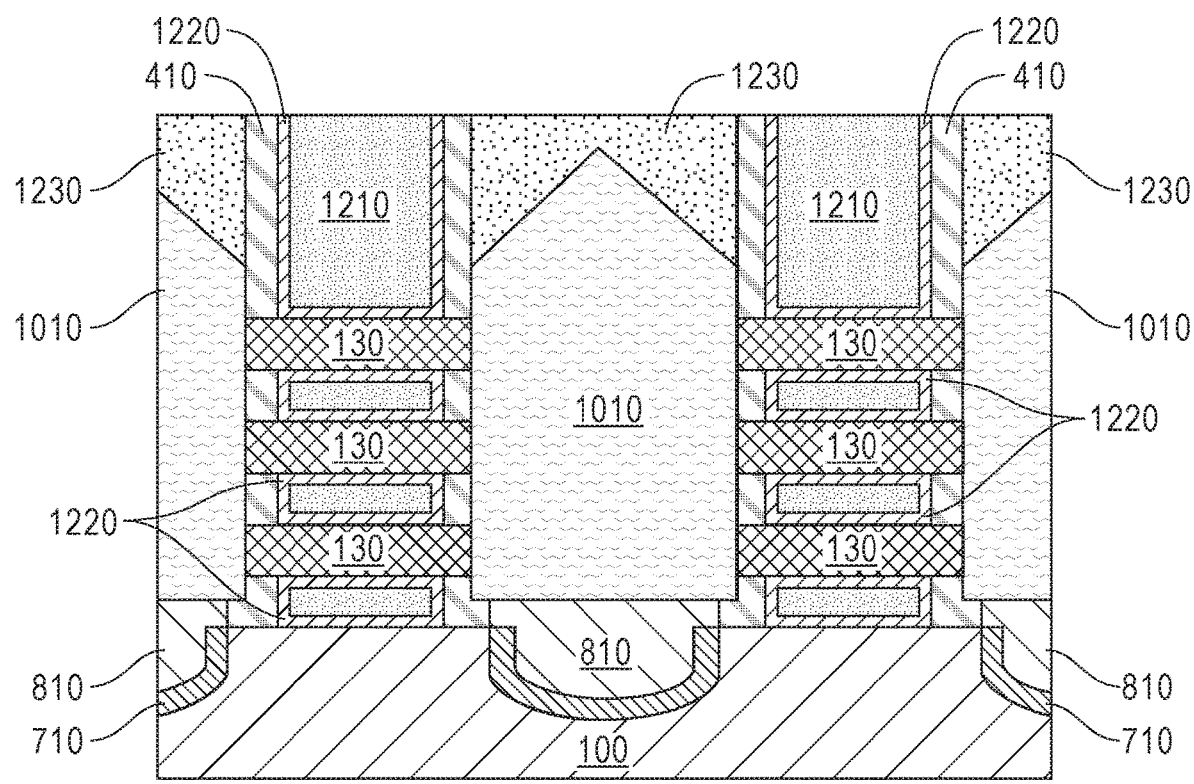
FIG. 11B depicts a cross-sectional view, along section line 11B of FIG. 11A, in accordance with an embodiment of the invention.

FIG. 11A depicts a top view and FIG. 11B depicts a cross-sectional view, along section line 11B of FIG. 11A, of fabrication steps, in accordance with an embodiment of the present invention. FIGS. 11A and 11B depict (i) the formation of interlevel dielectric (ILD) material 1230, (ii) the removal of each sacrificial gate structure (i.e., sacrificial gate structure 210 and dielectric spacer material layer 220) and each recessed sacrificial semiconductor material nanosheet (i.e., sacrificial semiconductor material layer 120), and (iii) forming a functional gate structure (gate conductor portion 1210, gate dielectric portion 1220) around a physically exposed surface of each semiconductor channel material nanosheet (i.e., semiconductor channel material layer 130).

The ILD material 1230 is formed above each source/drain region 1010 and above STI material 310 (at the adjacent region). In some embodiments, each gate includes a sacrificial cap 1240, as depicted in FIG. 11A. Sacrificial cap 1240 is not depicted in FIG. 11B but may be located, for example, on top of the depicted gate structure (gate conductor portion 1210, gate dielectric portion 1220). In some embodiments, ILD material 1230 covers exposed portions of sacrificial cap 1240. In other embodiments, sacrificial cap 1240 is formed above ILD material 1230.

It should be noted that FIG. 11A is depicted with ILD material 1230 being semitransparent, for illustration purposes only, and, accordingly, is not labeled as ILD material 1230. Rather, FIG. 11A is labeled to show the material beneath ILD material 1230 such as, for example, STI material 310, source/drain region 1010, and sacrificial cap 1240.

ILD material 1230 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material 1230. The use of a self-planarizing dielectric material as ILD material 1230 may avoid the need to perform a subsequent planarizing step.

In one embodiment, ILD material 1230 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as ILD material 1230, a planarization process or an etch back process follows the deposition of the dielectric material that provides ILD material 1230. As is shown in FIG. 11B, ILD material 1230 that is present atop each source/drain region 1010 has a topmost surface that is coplanar with a topmost surface of the functional gate structure (gate conductor portion 1210, gate dielectric portion 1220) to be subsequently formed.

After providing ILD material 1230, a horizontal portion of dielectric gate spacer material layer 410 is removed from atop each sacrificial gate structure 210, and thereafter each sacrificial gate structure 210 is removed to provide a gate cavity (not specifically shown). The removal of the horizontal portion of dielectric gate spacer material layer 410 that is above each sacrificial gate structure 210 can be performed utilizing one or more anisotropic etching processes.

Next, each semiconductor channel material nanosheet (i.e., semiconductor channel material layer 130) is suspended by selectively etching each recessed sacrificial semiconductor material nanosheet (i.e., sacrificial semiconductor material layer 120) relative to each semiconductor channel material nanosheet (i.e., semiconductor channel material layer 130). A functional gate structure (gate conductor portion 1210, gate dielectric portion 1220) is then formed in each gate cavity and surrounding a physically exposed surface of each semiconductor channel material nanosheet (i.e., semiconductor channel material layer 130). By "functional gate structure" it is meant a permanent gate structure used to control output current (i.e., flow of carriers in the channel) of a semiconducting device through electrical or magnetic fields. Although a single functional gate structure is described and illustrated, a plurality of functional gate structures can be formed.

The functional gate structure (gate conductor portion 1210, gate dielectric portion 1220) may include gate dielectric portion 1220 and gate conductor portion 1210. Gate dielectric portion 1220 may include a gate dielectric material. The gate dielectric material that provides gate dielectric portion 1220 can be an oxide, nitride, and/or oxynitride. In one example, the gate dielectric material that provides gate dielectric portion 1220 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as gate dielectric portion 1220.

The gate dielectric material used in providing gate dielectric portion 1220 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing gate dielectric portion 1220 can have a thickness in a range from 1 nm to 10 nm. Other thicknesses that are lesser than, or greater than, the aforementioned thickness range can also be employed for the gate dielectric material that may provide gate dielectric portion 1220.

Gate conductor portion 1210 can include a gate conductor material. The gate conductor material used in providing gate conductor portion 1210 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide), or multilayered combinations thereof. In one embodiment, gate conductor portion 1210 may comprise an nFET gate metal. In another embodiment, gate conductor portion 1210 may comprise a pFET gate metal. When multiple gate cavities are formed, it is possible to form a nFET in a first set of the gate cavities and wrapping around some of the semiconductor channel material nanosheet (i.e., semiconductor channel material layer 130) and a pFET in a second set of the gate cavities and wrapping around some of the semiconductor channel material nanosheet (i.e., semiconductor channel material layer 130).

The gate conductor material used in providing gate conductor portion 1210 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing gate conductor portion 1210 can have a thickness from 50 nm to 200 nm. Other thicknesses that are lesser than, or greater than, the aforementioned thickness range can also be employed for the gate conductor material used in providing gate conductor portion 1210.

The functional gate structure (gate conductor portion 1210, gate dielectric portion 1220) can be formed by providing a functional gate material stack of the gate dielectric material, and the gate conductor material. A planarization process may follow the formation of the functional gate material stack.

Sacrificial cap 1240 may be formed on exposed surfaces of the functional gate structure (gate conductor portion 1210, gate dielectric portion 1220) and dielectric gate spacer material layer 410, in accordance with an embodiment of the invention. In various embodiments of the invention, sacrificial cap 1240 comprises any dielectric spacer material, including, for example, a dielectric nitride, dielectric oxide, and/or dielectric oxynitride. In one example, sacrificial cap 1240 is composed of a non-conductive low-capacitance dielectric material such as silicon dioxide ($SiO_2$). It should be appreciated that any other acceptable materials for forming a dielectric spacer can be used in embodiments of the present invention. For example, the process of forming sacrificial cap 1240 may include depositing a conformal layer (not shown) of insulating material, such as nitride, over exposed surfaces of the functional gate structure (gate conductor portion 1210, gate dielectric portion 1220) and dielectric gate spacer material layer 410. Sacrificial cap 1240 can be deposited using, for example, chemical vapor deposition (CVD), plasma enhanced chemical vapor deposition (PECVD), or physical vapor deposition (PVD).

Figure 12A:
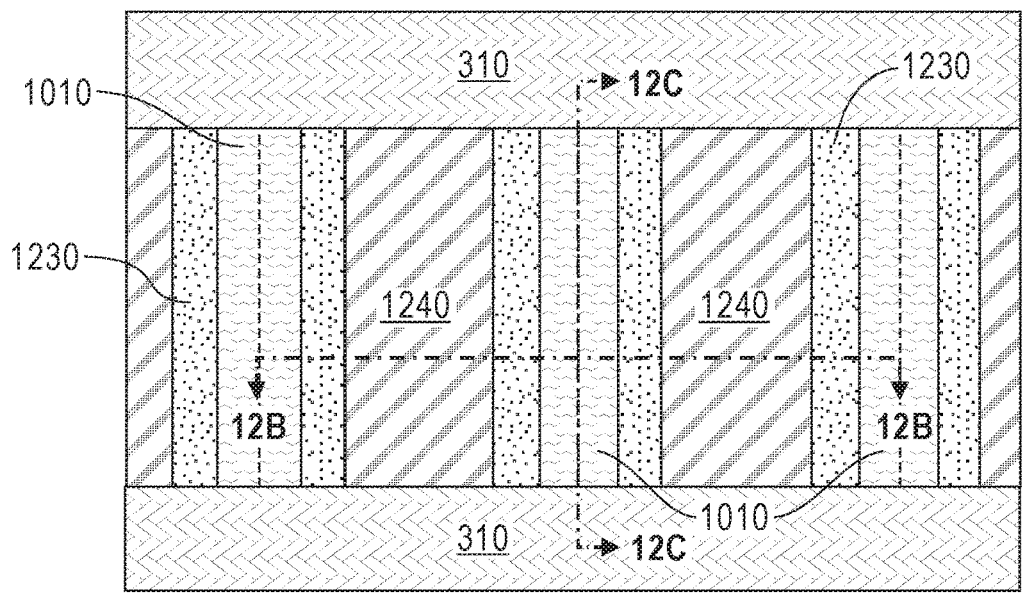
FIG. 12A depicts a top view of the removal of portion(s) of the ILD material to form one or more contact trenches, in accordance with an embodiment of the invention.
Figure 12B:
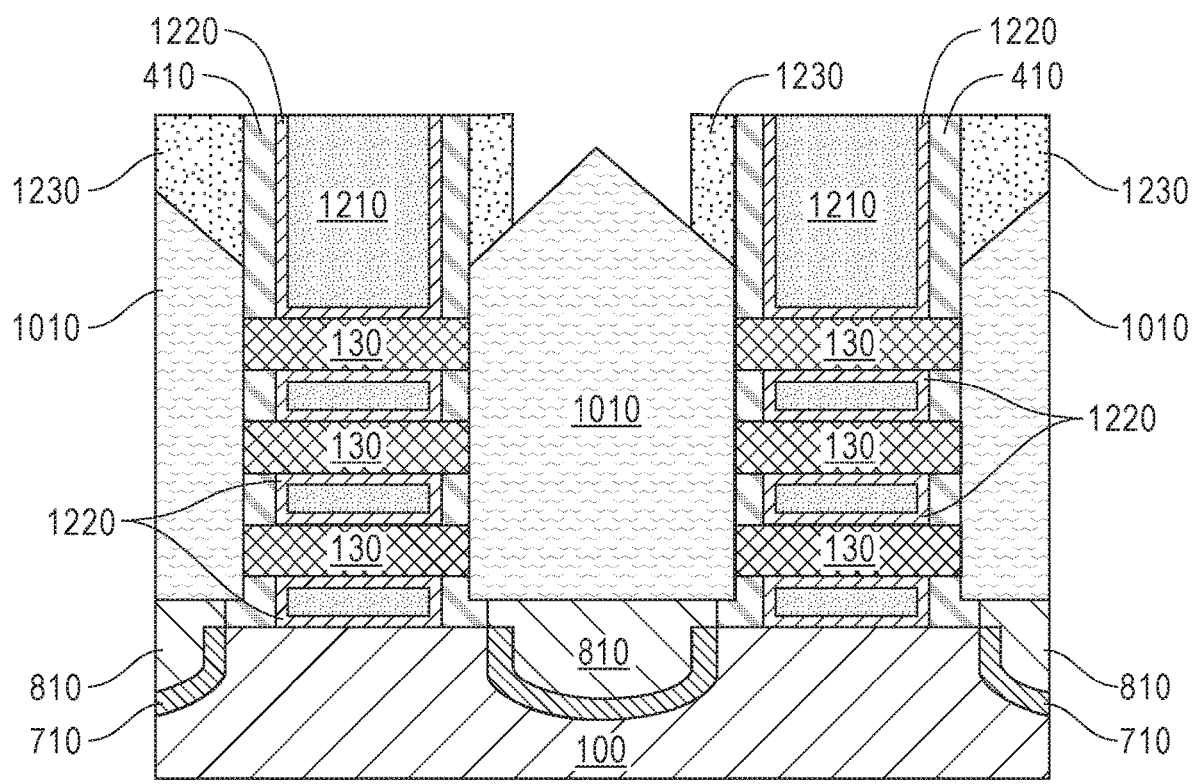
FIG. 12B depicts a cross-sectional view, alone section line 12B of FIG. 12A, in accordance with an embodiment of the invention.
Figure 12C:
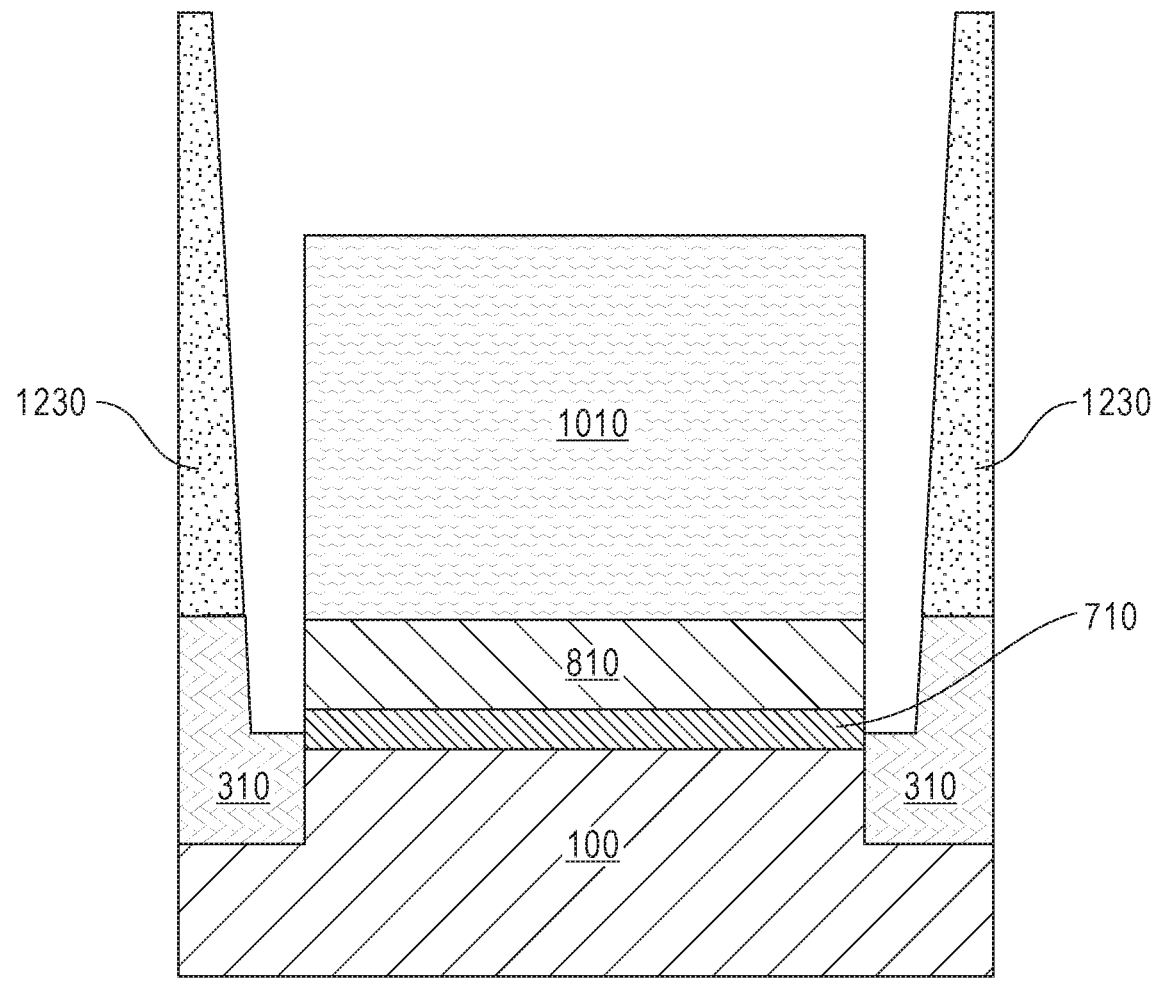
FIG. 12C depicts a cross-sectional view, along section line 12C of FIG. 12A, in accordance with an embodiment of the invention.

FIG. 12A depicts a top view, FIG. 12B depicts a cross-sectional view, along section line 12B of FIG. 12A, and FIG. 12C depicts a cross-sectional view, along section line 12C of FIG. 12A, of fabrication steps, in accordance with an embodiment of the present invention. FIG. 12A is again, similarly to FIG. 11A, presented with ILD material 1230 illustrated as semi-transparent, for illustrative purposes only. FIGS. 12A-12C depict the removal of portion(s) of ILD material 1230 to form one or more contact trenches.

As depicted in FIGS. 12A and 12C, the contact trenches extend either side of beyond/source drain epitaxy 1010 into a portion of STI material 310 (i.e., above the adjacent region). In some embodiments, the contact trenches each have a depth as depicted in FIG. 12C. The contact trenches result in laterally exposing portions of source/drain region 1010 and Ge layer 810. In some embodiments, portions of epitaxial oxide 710 are also, at least partially, laterally exposed.

In embodiments of the invention, each contact trench may be formed by a selective etching process that selectively removes ILD material 1230 and STI material 310 within the trench. In some embodiments, this etching can be performed using an anisotropic etch such as reactive ion etching (RIE). The etch can be performed using one or more etching processes that selectively affect ILD material 1230 and/or STI material 310. Masking material (not shown) may be applied to the top of the device prior to etching each contact trench which resists etching and can be utilized to form the desired shape of the contact trench, such as, for example as the shape depicted in FIG. 12A. In some embodiments, the masking material may be a photoresist which has been patterned using photolithography.

Figure 13A:
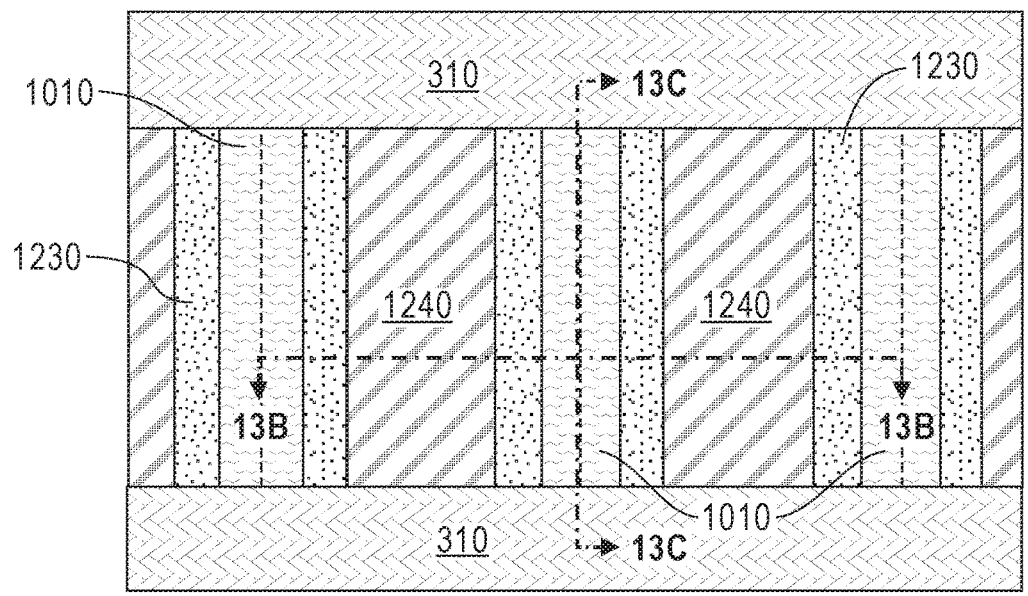
FIG. 13A depicts a top view of the removal of the germanium layer, in accordance with an embodiment of the invention.
Figure 13B:
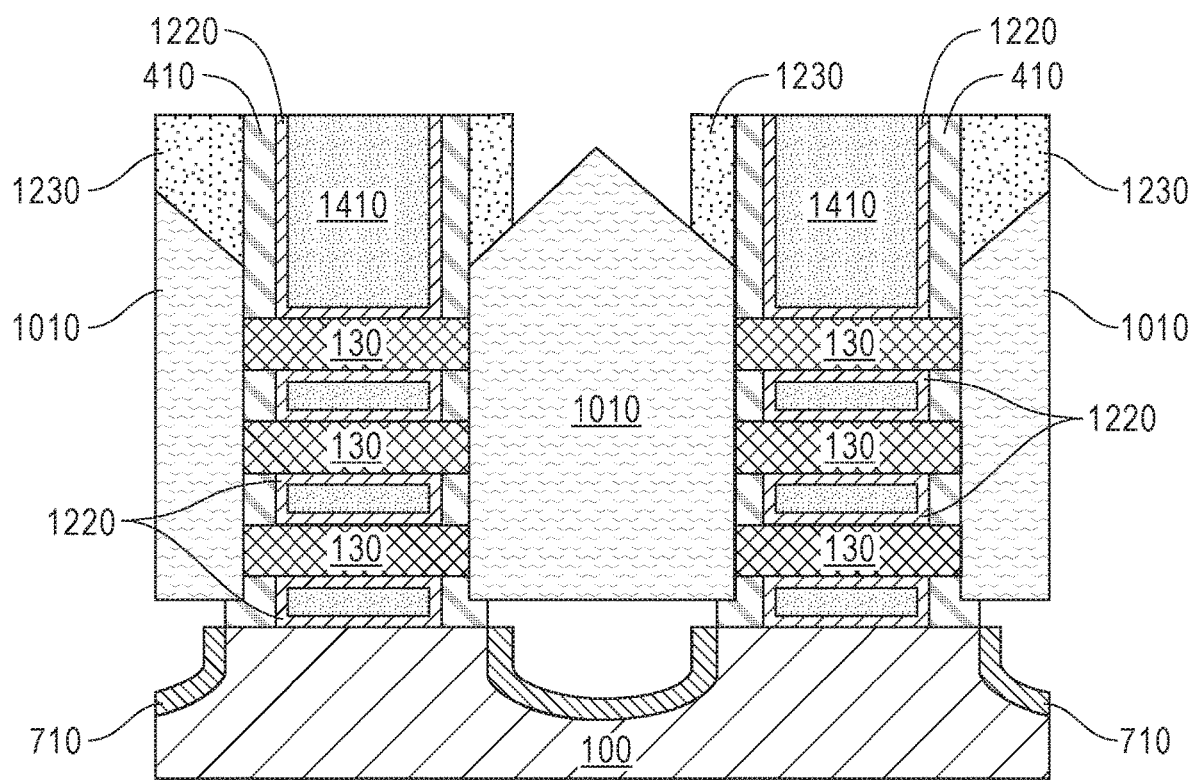
FIG. 13B depicts a cross-sectional view, alone section line 13B of FIG. 13A, in accordance with an embodiment of the invention.
Figure 13C:
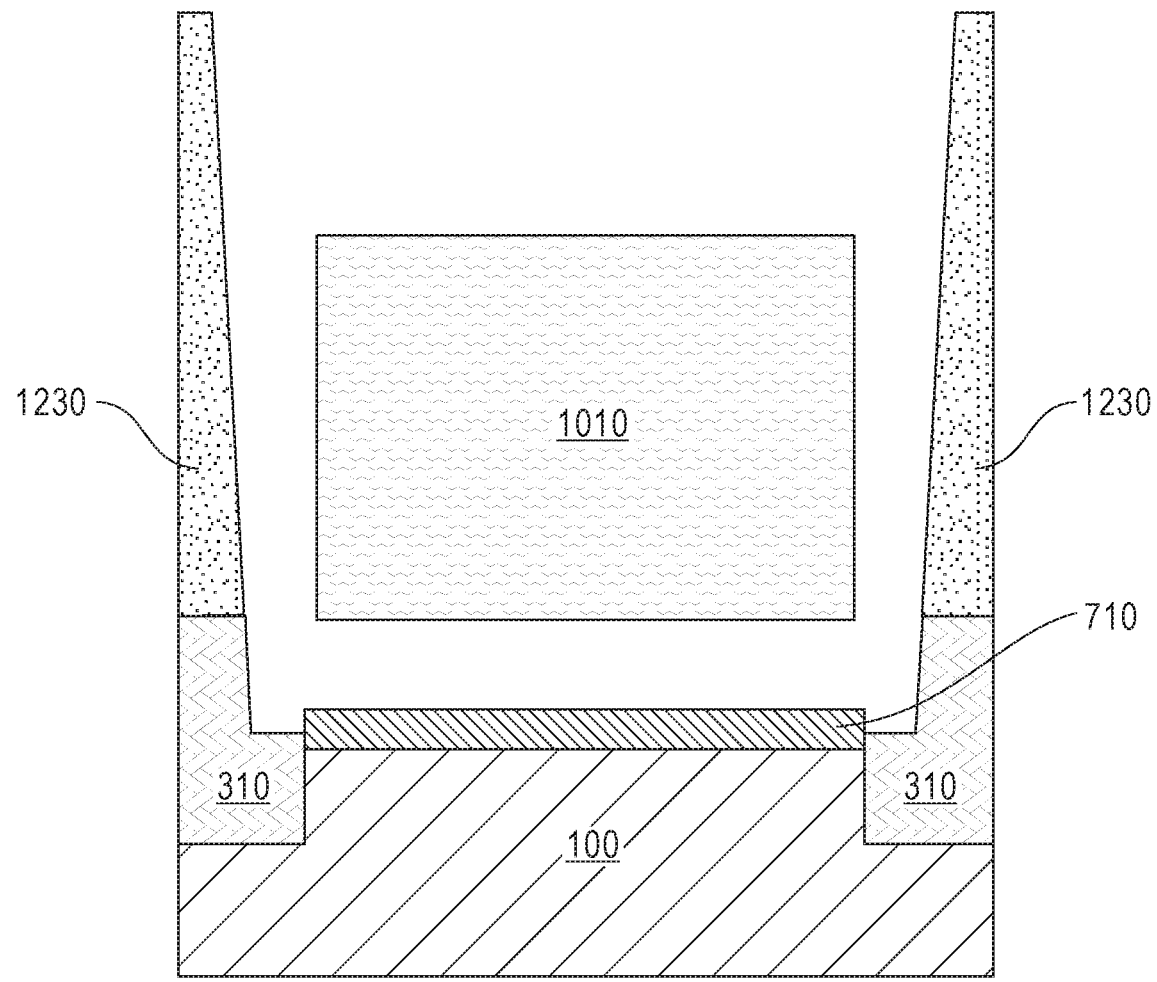
FIG. 13C depicts a cross-sectional view, along section line 13C of FIG. 13A, in accordance with an embodiment of the invention.

FIG. 13A depicts a top view, FIG. 13B depicts a cross-sectional view, along section line 13B of FIG. 13A, and FIG. 13C depicts a cross-sectional view, along section line 13C of FIG. 13A, of fabrication steps, in accordance with an embodiment of the present invention. FIG. 13A is again, similarly to FIGS. 11A and 12A, presented with ILD material 1230 illustrated as semi-transparent, for illustrative purposes only. FIGS. 13A-13C depict the removal of Ge layer 810. The removal of Ge layer 810 causes source/drain region 1010 to be suspended and creates a gap between source/drain region 1010 and epitaxial oxide 710.

In embodiments of the invention, an etching process is utilized to remove Ge layer 810. A selective etching process may be performed to selectively remove Ge layer 810. In some embodiments, this etching can be performed using an anisotropic etch such as reactive ion etching (RIE). The etch can be performed using etching processes that selectively affect Ge layer 810. The etching of Ge layer 810 may be performed utilizing a lateral etching process that is selective in removing Ge layer 810. Such selective and lateral etching may create the structure that is depicted in FIG. 13B. In some embodiments, the lateral etching process is a wet etch. In some embodiments, the wet etch uses warm hydrogen peroxide. Embodiments of the present invention recognize that any type of lateral etching process capable of selectively etching Ge layer 810 may be utilized.

Figure 14A:
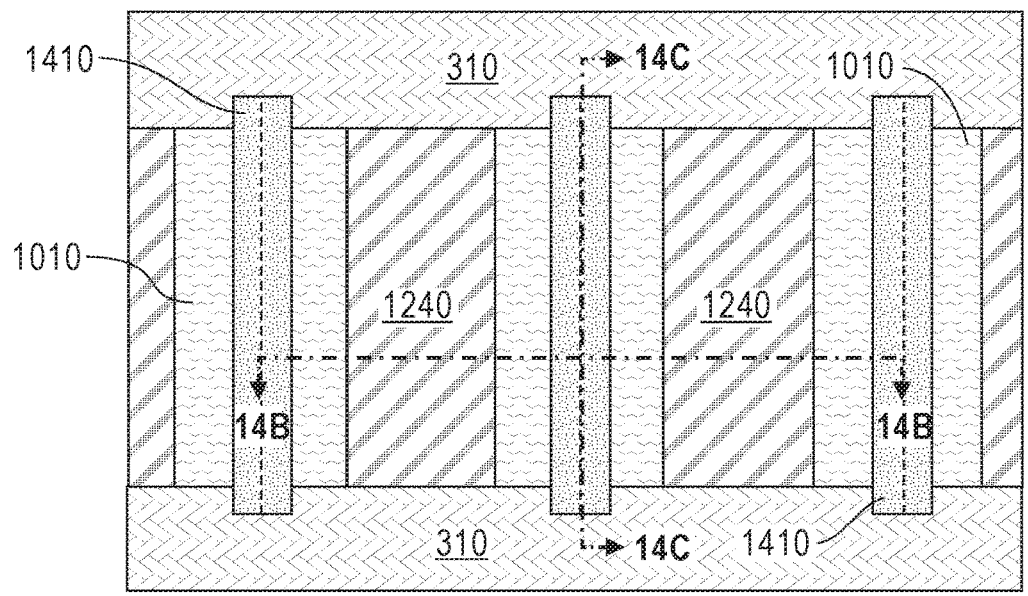
FIG. 14A depicts a top view of the formation of a wrap around contact, in accordance with an embodiment of the invention.
Figure 14B:
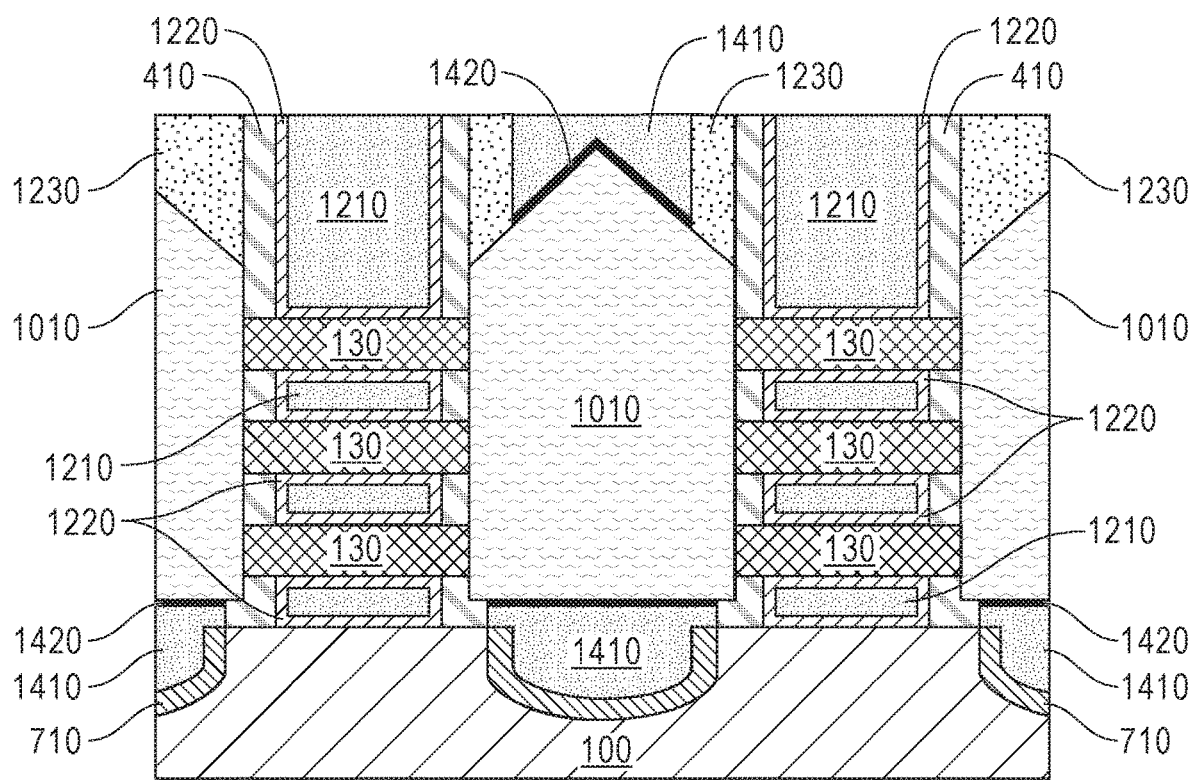
FIG. 14B depicts a cross-sectional view, alone section line 14B of FIG. 14A, in accordance with an embodiment of the invention.
Figure 14C:
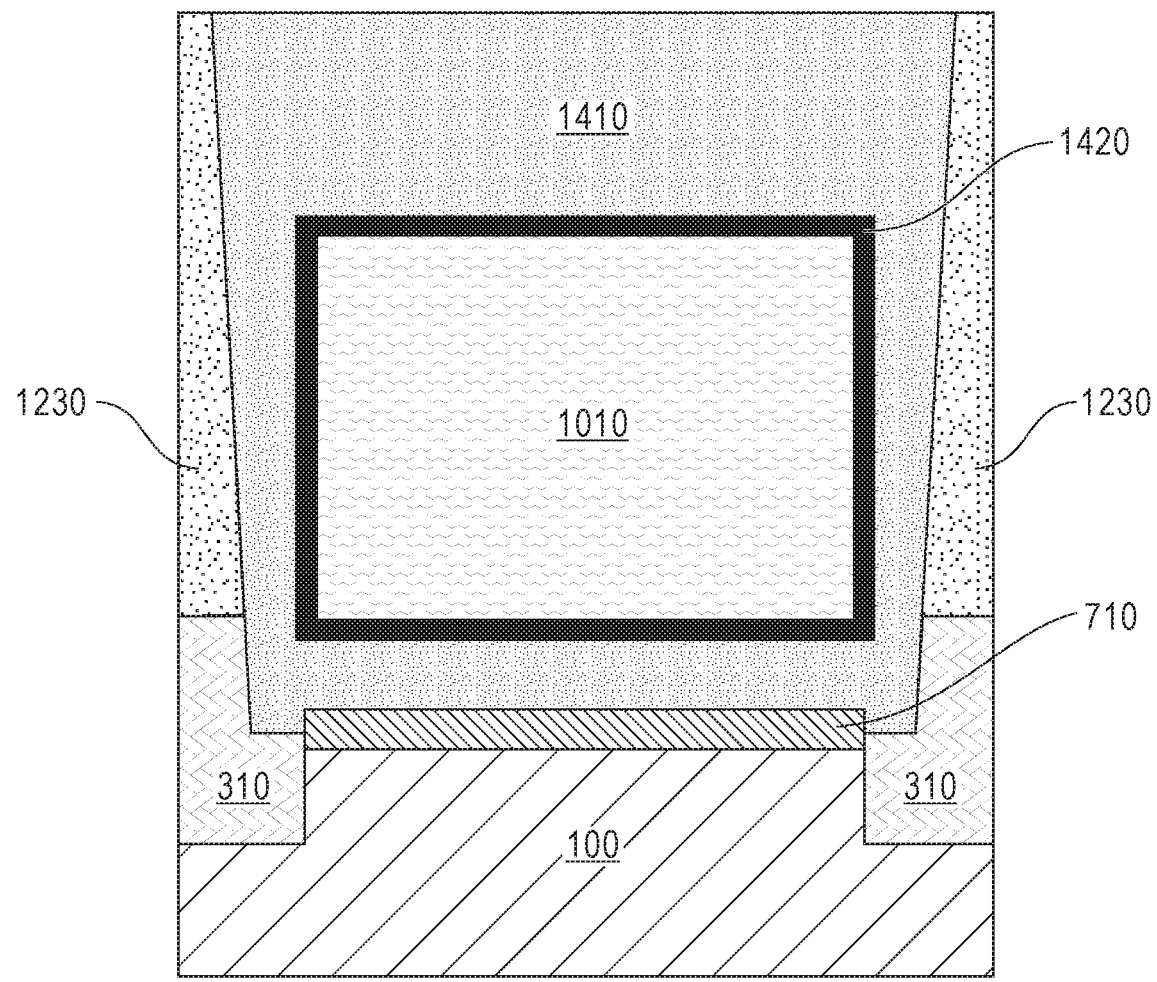
FIG. 14C depicts a cross-sectional view, along section line 14C of FIG. 14A, in accordance with an embodiment of the invention.

FIG. 14A depicts a top view, FIG. 14B depicts a cross-sectional view, along section line 14B of FIG. 14A, and FIG. 14C depicts a cross-sectional view, along section line 14C of FIG. 14A, of fabrication steps, in accordance with an embodiment of the present invention. FIG. 14A is again, similarly to FIGS. 11A, 12A, and 13A, in that FIG. 14A is presented with ILD material 1230 illustrated as semi-transparent, for illustrative purposes only. FIGS. 14A-14C depict the formation of a wrap around contact (silicide layer 1420, contact layer 1410) around source/drain region 1010.

The wrap around contact may be formed by, for example, depositing (e.g., by PVD), a metal layer (e.g., titanium) on exposed surfaces of source/drain region 1010. The metal layer may be conformally formed so as to conform to a surface of source/drain region 1010. A conventional silicide process may be employed. For example, the device may be exposed to high temperatures in order to promote the chemical reactions between the metal layer (e.g., titanium) and the surface of source/drain region 1010, and form silicide layer 1420. In some embodiments, the heating process may be performed prior to the deposition of contact layer 1410. In other embodiments, the heating process may be performed subsequent to the deposition of contact layer 1410. Any deposition process may be used for the formation of the metal layer including, for example, chemical vapor deposition (CVD), plasma enhanced chemical vapor deposition (PECVD), physical vapor deposition (PVD), sputtering, or atomic layer deposition. In other embodiments, co-evaporation techniques may be utilized to form silicide layer 1420. Co-evaporation consists of the simultaneous deposition of metal and silicon under high vacuum conditions. In co-evaporation, possible heating techniques used include electron beam, rf induction, with a laser, or by resistive heating. In yet other embodiments, known sputter deposition or chemical vapor deposition techniques may be utilized to form silicide layer 1420. In one embodiment of the present application, silicide can have a thickness in a range from 1 nm to 5 nm. Other thicknesses that are lesser than, or greater than, the aforementioned thickness range can also be employed.

In some embodiments, contact layer 1410 is deposited such that contact layer 140 surrounds silicide layer 1420 and fills the remaining area of the contact trench discussed with respect to FIGS. 12A-12C. Contact layer 1410 may be in direct contact with silicide layer 1420, ILD material 1230, STI material 310, and bottom isolation layer 110.

Contact layer 1410 can include a conductive material including, for example, titanium, tantalum, hafnium, zirconium, niobium, or allows comprising carbon. However, other materials are applicable as well.

Contact layer 1410 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, contact layer 1410 can have a thickness from 50 nm to 200 nm. Other thicknesses that are lesser than, or greater than, the aforementioned thickness range can also be employed for contact layer 1410.

As illustrated in FIGS. 14A-14C, the depicted semiconductor structure includes a plurality of stacked and suspended semiconductor channel material nanosheets (e.g., semiconductor channel material layer 130) located above semiconductor substrate 100. A functional gate structure (gate conductor portion 1210, gate dielectric portion 1220) is located surrounding a portion of each semiconductor channel material nanosheet (e.g., semiconductor channel material layer 130) of the plurality of stacked and suspended semiconductor channel material nanosheets (e.g., semiconductor channel material layer 130). Source/drain region 1010 is located on each side of the functional gate structure (gate conductor portion 1210, gate dielectric portion 1220) and physically contacting sidewalls of each semiconductor channel material nanosheet (e.g., semiconductor channel material layer 130) of the plurality of stacked and suspended semiconductor channel material nanosheets. ILD material 1230 is located above each S/D region 26, with the exception of the area that includes the wrap around contact. A wrap around contact (contact layer 1410, silicide layer 1420) surrounds source/drain region 1010 making contact with source/drain region 1010 on the top, bottom, and sidewalls (i.e., sidewalls of source/drain epitaxy that are not already contacting semiconductor channel material layer 130) of source/drain region 1010. The device further includes dielectric gate spacer material layer 410 contacting sidewalls of the functional gate structure (gate conductor portion 1210, gate dielectric portion 1220) and located on an outer portion of each semiconductor channel material nanosheet (e.g., semiconductor channel material layer 130) of the plurality of stacked and suspended semiconductor channel material nanosheets. In the depicted structure, the functional gate structure (gate conductor portion 1210, gate dielectric portion 1220) wraps around each suspended semiconductor channel material nanosheet (e.g., semiconductor channel material layer 130). In some embodiments, a bottom isolation layer (not shown) is present atop semiconductor substrate 100 and beneath the functional gate structure and dielectric gate spacer material layer 410.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A semiconductor structure comprising:
a plurality of stacked and suspended semiconductor channel material nanosheets located above a semiconductor substrate;
a functional gate structure surrounding a portion of each semiconductor channel material nanosheet of the plurality of stacked and suspended semiconductor channel material nanosheets, the functional gate structure comprising a gate dielectric portion and a gate conductor portion;
a source/drain region on each side of the functional gate structure and physically contacting sidewalls of each semiconductor channel material nanosheet of the plurality of stacked and suspended semiconductor channel material nanosheets;

a contact region wrapping completely around a portion of each source/drain region such that (i) a top surface of the contact region is coplanar with a top surface of the gate conductor portion of the functional gate structure and (ii) a bottom surface of the contact region is lower than a bottom surface of the functional gate; and an epitaxial oxide layer between the contact region and the semiconductor substrate, a top surface of the epitaxial oxide layer coplanar with a top surface of the semiconductor substrate.

2. The semiconductor structure of claim 1, wherein the contact region includes a silicide layer physically contacting and wrapping around each source/drain region.

3. The semiconductor structure of claim 1, wherein each of the stacked and suspended semiconductor channel material nanosheets comprises at least three nanosheets.

4. The semiconductor structure of claim 1, further comprising an interlevel dielectric (ILD) material located directly on a surface of each source/drain region and laterally adjacent to each contact region.

5. The semiconductor structure of claim 4, further comprising a region that includes a shallow trench isolation (STI) material that is physically contacting the ILD material and the contact region.

6. The semiconductor structure of claim 5, wherein:
the STI material is beneath the ILD material;
the STI material is beneath and laterally adjacent to the contact region.

7. The semiconductor structure of claim 5, wherein the STI material is physically contacting the semiconductor substrate.

8. The semiconductor structure of claim 1, further comprising inner gate spacers (i) contacting sidewalls of the functional gate structure, (ii) located on an outer portion of each semiconductor channel material nanosheet of the plurality of stacked and suspended semiconductor channel material nanosheets, and (iii) contacting sidewalls of the source/drain region.

9. The semiconductor structure of claim 1, wherein the sidewalls of each semiconductor channel material nanosheet of the plurality of stacked and suspended semiconductor channel material nanosheets are vertically aligned to one another.

10. The semiconductor structure of claim 1, wherein:
the gate dielectric portion physically contacts the semiconductor channel material nano sheet; and
the gate conductor portion physically contacts the gate dielectric portion.

11. The semiconductor structure of claim 1, wherein the semiconductor substrate and each semiconductor channel material nanosheet is composed of a same semiconductor material.

\* \* \* \* \*